US012578653B2

(12) United States Patent
Smorenberg et al.

(10) Patent No.: US 12,578,653 B2
(45) Date of Patent: Mar. 17, 2026

(54) METHOD FOR DETERMINING A SAMPLING SCHEME, A SEMICONDUCTOR SUBSTRATE MEASUREMENT APPARATUS, A LITHOGRAPHIC APPARATUS

(71) Applicant: ASML NETHERLANDS B.V., Veldhoven (NL)

(72) Inventors: Pieter Gerardus Jacobus Smorenberg, Rotterdam (NL); Putra Saputra, Singapore (SG); Khalid Elbattay, Eindhoven (NL); Paul Derwin, Eindhoven (NL); Roy Werkman, Eindhoven (NL); Erik Jensen, Veldhoven (NL); Hyunwoo Yu, Veldhoven (NL); Gautam Sarma, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1066 days.

(21) Appl. No.: 17/612,601

(22) PCT Filed: May 11, 2020

(86) PCT No.: PCT/EP2020/063077
§ 371 (c)(1),
(2) Date: Nov. 19, 2021

(87) PCT Pub. No.: WO2020/234028
PCT Pub. Date: Nov. 26, 2020

(65) Prior Publication Data
US 2022/0260920 A1    Aug. 18, 2022

(30) Foreign Application Priority Data

May 22, 2019    (EP) ..................................... 19176024
May 8, 2020    (EP) ..................................... 20173733

(51) Int. Cl.
*G03F 7/00* (2006.01)

(52) U.S. Cl.
CPC .......... *G03F 7/705* (2013.01); *G03F 7/70558* (2013.01); *G03F 7/70633* (2013.01)

(58) Field of Classification Search
CPC .. G03F 7/70558; G03F 7/70616; G03F 7/705; G03F 7/70633
See application file for complete search history.

(56) References Cited

U.S. PATENT DOCUMENTS 10,241,418 B2    3/2019   Hauptmann et al.
10,627,729 B2 *   4/2020   Schmitt-Weaver ... G03F 9/7019
(Continued)

FOREIGN PATENT DOCUMENTS

JP    2013074294    4/2013
JP    2013247258    12/2013
(Continued)

OTHER PUBLICATIONS

Office Action dated Nov. 8, 2022, issued in corresponding Japanese Patent Application No. 2021-564432, pp. 1-5.
(Continued)

*Primary Examiner* — An H Do
(74) *Attorney, Agent, or Firm* — Pillsbury Winthrop Shaw Pittman, LLP

(57) ABSTRACT

A method for determining a sampling scheme, the method including: obtaining a first fingerprint model relating to a first spatial distribution of a performance parameter over a first portion of a semiconductor substrate and a second fingerprint model relating to a second spatial distribution of the performance parameter over a second portion of the semiconductor substrate; and determining a sampling point corresponding to a measuring location on the semiconductor substrate for generating measurement data based on an (Continued)

expected reduction of a first uncertainty metric associated with evaluation of the first fingerprint model over the first portion and an expected reduction of a second uncertainty metric associated with evaluation of the second fingerprint model over the second portion.

21 Claims, 7 Drawing Sheets

(56) References Cited

U.S. PATENT DOCUMENTS

| | | | |
|---|---|---|---|
| 11,022,896 | B2 | 6/2021 | Schmitt-Weaver et al. |
| 11,156,923 | B2 | 10/2021 | Cekli et al. |
| 2011/0170091 | A1 | 7/2011 | Chang et al. |
| 2012/0008127 | A1 | 1/2012 | Tel et al. |
| 2013/0230797 | A1 | 9/2013 | Van Der Sanden et al. |
| 2018/0356736 | A1 | 12/2018 | Danilin |

FOREIGN PATENT DOCUMENTS

| | | |
|---|---|---|
| JP | 2018-501511 | 1/2018 |
| JP | 2018508049 | 3/2018 |
| JP | 2019511001 | 4/2019 |
| WO | 2013092106 | 6/2013 |
| WO | 2014063055 | 4/2014 |
| WO | 2015110191 | 7/2015 |
| WO | 2016146217 | 9/2016 |
| WO | 2016162231 | 10/2016 |
| WO | 2018121921 | 7/2018 |
| WO | 2018153711 | 8/2018 |
| WO | 2018192789 | 10/2018 |

OTHER PUBLICATIONS

International Search Report and Written Opinion issued in corresponding PCT Patent Application No. PCT/2020/063077, dated Aug. 31, 2020.

"Methods for trading of two or more conflicting requirements on sampling in lithography", Research Disclosure 588032, vol. 588, No. 32 (2013).

Office Action issued in corresponding Japanese Patent Application No. 2023-077897, dated Feb. 9, 2024.

Office Action issued in Japanese Patent Application No. 2024-107925, dated May 2, 2025.

* cited by examiner

METHOD FOR DETERMINING A SAMPLING SCHEME, A SEMICONDUCTOR SUBSTRATE MEASUREMENT APPARATUS, A LITHOGRAPHIC APPARATUS

CROSS-REFERENCE TO RELATED APPLICATIONS

This application is the U.S. national phase entry of PCT Patent Application No. PCT/EP2020/063077 which was filed on May 11, 2020, which claims the benefit of priority of European Patent Application No. 19176024.8 which was filed on May 22, 2019 and European Patent Application No. 20173733.5 which was filed on May 8, 2020 which are incorporated herein in their entireties by reference.

FIELD

The present description relates to a method of generating an efficient sampling scheme which can be used for measuring and/or inspecting a specimen or a substrate such as a semiconductor device. The results of the measurement and/or inspection can be used to control a lithographic apparatus.

BACKGROUND

A lithographic process is one that applies a desired pattern onto a substrate, usually onto a target portion of the substrate. A lithographic apparatus (scanner) can be used, for example, in the manufacture of integrated circuits (ICs). In that instance, a patterning device, which is alternatively referred to as a mask or a reticle, may be used to generate a product pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. Stepping and/or scanning movements can be involved, to repeat the pattern at successive target portions across the substrate. It is also possible to transfer the pattern from the patterning device to the substrate by imprinting the pattern onto the substrate. The pattern can be transformed into functional product features by further processing steps.

A key performance parameter of the lithographic process is the overlay error. This error, often referred to simply as "overlay" is the error in placing a product features in the correct position relative to features formed in previous layers. As product feature become all that much smaller, overlay specifications become ever tighter.

Currently the overlay error is controlled and corrected by means of correction models described for example in US2013230797A1. Advanced process control techniques have been introduced in recent years and use measurements of metrology targets applied to substrates alongside the applied device pattern. These targets allow overlay to be measured using a high-throughput inspection apparatus such as a scatterometer, and the measurements can be used to determine an overlay fingerprint and subsequently generate corrections that are fed back into the lithographic apparatus when patterning subsequent substrates. Examples of advanced process control (APC) are described for example in US2012008127A1. The inspection apparatus may be separate from the lithographic apparatus. Instead of using the measurements directly for defining control actions, it is often preferred to first apply a correction model to the measurement values corresponding to the overlay targets provided on the substrate. The modeled measurement data typically has less noise and allows definition of control actions even at small spatial scales across the wafer. The correction models nowadays typically include higher order terms, to correct for non-linear distortions of the wafer. The non-linear distortions may be associated with many effects. These effects may be processing induced deformations of the substrate, for example due to stress component introduced during annealing, etch or layer deposition steps of the patterning process. The correction models may also be expanded to take into account other measurements and/or calculated effects such as thermal deformation during a patterning operation.

While the use of higher order models may be able take into account more effects, however, such models require that more position measurements are made. Further, higher order correction models require more computing power and/or take more time to calculate. Thus, using a higher order correction model may in certain circumstances be feasible in theory, but may not be economically viable in practice since it would negatively influence throughput of the lithographic process (i.e. wafers per hour). Additionally, higher order correction models may be of limited use, if the patterning apparatus itself does not provide control at a spatial resolution corresponding to the spatial scale of the higher order terms of the correction model.

As is described in WO2016/146217, certain components of the overlay fingerprint will vary randomly from substrate to substrate. However, other components will be systematic in nature, whether their cause is known or not. Where similar substrates have similar patterns of a performance parameter, e.g. overlay error, the patterns of the performance parameter may be referred to as "fingerprints" of the lithographic process. Performance parameters such as overlay errors can broadly be categorized into two distinct groups:

1) contributions which vary across an entire substrate, wafer are known in the art as inter-field fingerprints,
2) contributions which vary similarly across each target portion (field) or sub-field of a substrate or wafer are known in the art as intra-field fingerprints.

In the cutting edge nodes or in 3D-NAND of semiconductor wafers, repetitive patterns of overlay error fingerprints induced by a wafer processing step, such as etching, are observed. These fingerprints can be compensated in terms of subfield overlay correction, that allows and/or requires scanner correction at high spatial frequencies.

WO2016/146217, which is incorporated by reference herein, discloses a method in which one or more sub-fields of a field are defined based on available data. Performance parameter data relating to each sub-field is processed to produce sub-field correction information. Exposures of the sub-fields are corrected using the sub-field correction information. By controlling the lithographic apparatus by reference to performance data of a particular sub-field within a field, overlay error can be minimized for critical features corresponding to that particular sub-field, rather than being averaged over the whole field. By controlling a lithographic apparatus with reference to sub-fields rather than only the whole field, residual errors can be reduced in one or more sub-fields. The performance parameter data associated with the one or more sub-fields may be modeled using a correction model specifically designed to the spatial scale of the performance parameter behavior at sub-field level.

The method as described in WO2016/146217 requires measuring performance parameters of the lithographic process (such as overlay error) at a high number of locations on the substrate, in particular distributed sufficiently dense across the one or more sub-fields in order to enable sufficiently accurate determination of the sub-field specific correction model. However it is often also required to sample the full substrate to determine accurately the correction model targeted to describe the performance parameter behaviour across the full substrate, or at least a portion larger than the sub-field. It is an objective of the invention to determine appropriate locations for measuring the performance parameter meeting the requirements as mentioned above.

SUMMARY

The description aims to provide a method for determining a sampling scheme, which can for example be used in measurement and/or inspection of a semiconductor substrate, and/or for controlling the lithographic process which is performed on a semiconductor substrate.

According to an embodiment of the invention a method for determining a sampling scheme is provided, which method comprises:

obtaining a first fingerprint model relating to a first spatial distribution of a performance parameter over a first portion of a semiconductor substrate and a second fingerprint model relating to a second spatial distribution of said performance parameter over a second portion of the semiconductor substrate; and determining a sampling point corresponding to a measuring location on the semiconductor substrate for generating measurement data based on an expected reduction of a first uncertainty metric associated with evaluation of the first fingerprint model over the first portion and an expected reduction of a second uncertainty metric associated with evaluation of the second fingerprint model over the second portion.

A single sampling point which has been determined in accordance with this embodiment, can be used to derive a model parameter of both the first and the second fingerprint model. Therewith, the number of measurements that has to be performed in order to obtain the model parameters can be reduced.

In an embodiment of said method for determining a sampling scheme, the first portion and the second portion at least partly overlap with each other.

This is a practical implementation of this embodiment, which allows for effective control of a lithographic apparatus.

In an embodiment of said method for determining a sampling scheme, the first fingerprint model is a global fingerprint model and the second fingerprint model is a local fingerprint model.

For example, the first fingerprint model is a fingerprint model of the entire upper face of the semiconductor substrate (inter-field), for example relating to a performance parameter of which the value is dependent on the position within the semiconductor substrate face as a whole, e.g. on the radial distance from the center of the substrate. The second fingerprint model is for example a fingerprint model of a part of the semiconductor substrate face, e.g. a field, die or cell (intra-field), for example relating to a performance parameter of which the value is dependent on the position within a part of the semiconductor substrate e.g. on the distance in x-direction or y-direction from the center of a field.

This is a practical implementation of this embodiment, which allows for effective control of a lithographic apparatus.

In an embodiment of said method for determining a sampling scheme, the first portion and/or the second portion is at least a part of an irradiated layer inside the semiconductor substrate or at the top surface of the semiconductor substrate.

This is a practical implementation of this embodiment, which allows for effective control of a lithographic apparatus.

In an embodiment of said method for determining a sampling scheme, the second portion is one of a field, a plurality of fields, a subfield, plurality of subfields, a die, a plurality of dies, a part of a die, a plurality of parts of dies, a cell, a plurality of cells, a part of a cell, or a plurality of parts of cells.

This is a practical implementation of this embodiment, which allows for effective control of a lithographic apparatus.

In an embodiment of said method for determining a sampling scheme, the performance parameter is an overlay error, critical dimension (e.g. line width), alignment mark position, side wall angle, edge roughness, edge placement error, and/or focus error.

This is a practical implementation of this embodiment, which allows for effective control of a lithographic apparatus.

In an embodiment of said method for determining a sampling scheme, the first fingerprint model and/or the second fingerprint model further relate to the spatial distribution of at least one further parameter.

For example, at least one further parameter is a prediction uncertainty of the first and/second fingerprint model, e.g. a normalized model uncertainty, G-optimality, least square error and/or moving standard deviation.

This is a practical implementation of this embodiment, which allows for effective control of a lithographic apparatus.

In an embodiment of said method for determining a sampling scheme, determining the position of the sampling point includes taking into account a drift in the first and/or the second spatial distribution of the performance parameter over time.

This allows for an accurate control of a lithographic apparatus.

In an embodiment of the method for establishing a sampling scheme, the method further comprises the step of determining an additional sampling point.

The number of additional sampling points preferably is less than the number of sampling points that are determined by any one of the embodiments of the methods as recited above.

So, the sampling scheme may contain only sampling points that have been determined by any one of the embodiments of the method as recited above. Alternatively, the sampling scheme may contain sampling points that have been determined by any one of the embodiments of the method as recited above as well as further sampling point which have been determined in different way.

In an embodiment of said method for establishing a sampling scheme, the method further includes:

identification of one or more critical areas on the semiconductor substrate, determining a higher number of sampling points per surface area for the one or more critical areas of the semiconductor substrate than for the other areas of the semiconductor substrate.

This allows to obtain an accurate control of a lithographic apparatus in the application of a pattern on the more critical areas of the substrate.

According to an embodiment of the invention, a method for generating measurement data from a semiconductor substrate is provided, which method comprises:

determining a position of a sampling point in accordance with any one of the embodiments of the method for determining a sampling scheme as recited above, generating measurement data by measuring the performance parameter at the location of the sampling point on the semiconductor substrate.

In this embodiment, a sampling point as determined in accordance with any one of the embodiments of the method for determining a sampling scheme as recited above is used for generating measurement data.

According to an embodiment of the invention, a method for generating measurement data from a semiconductor substrate is provided, which method comprises:

receiving information relating to a position of a sampling point, which position has been determined in accordance with any one of the embodiments of the method for determining a sampling scheme as recited above, generating measurement data by measuring the performance parameter at the location of the sampling point on the semiconductor substrate.

Optionally, this method further comprises the step of determining a model parameter of the first fingerprint model and a model parameter of the second fingerprint model based on the generated measurement data.

In this embodiment, a sampling point as determined in accordance with any one of the embodiments of the method for determining a sampling scheme as recited above is used for generating measurement data, and optionally in addition for determining a model parameter of the first fingerprint model and a model parameter of the second fingerprint model based on the generated measurement data.

According to an embodiment of the invention, a method for determining model parameters is provided, which method comprises:

generating measurement data from a semiconductor substrate in accordance with an embodiment of a method for generating measurement data from a semiconductor substrate as recited above, determining a model parameter of the first fingerprint model and a model parameter of the second fingerprint model based on the generated measurement data.

Optionally, this method is used in a method for controlling a lithographic apparatus, which method further comprises the following steps:

arranging a semiconductor substrate in a lithographic apparatus, applying a pattern on said semiconductor substrate in the lithographic apparatus, controlling the application of the pattern based on the basis of control input data, which control input data is at least partly based on said model parameter of the first fingerprint model and/or the model parameter of the second fingerprint model.

For example, controlling the application of the pattern on the semiconductor substrate includes controlling a movement of the semiconductor substrate relative to the exposure light from the pattern application system of the lithographic apparatus and/or controlling a movement of the patterning device, i.e. reticle, relative to the illumination light of the illumination system. Another example of controlling the application of the pattern on the semiconductor substrate includes controlling the position and/or orientation of lens in the pattern application system, controlling of the illumination setting of the illumination system, controlling of the focus of the exposure light, and/or controlling of the dose of the exposure light.

In this embodiment, the semiconductor substrate from which the measurement data is generated can be the same semiconductor substrate which is arranged in the lithographic apparatus, or a different one.

In this embodiment, the measurements which are carried out at the sampling points are used to efficiently control a lithographic apparatus.

According to an embodiment of the invention, a computer program product is provided which contains one or more sequences of machine-readable instructions, which is configured to carry out an embodiment of any of the methods recited above.

According to an embodiment of the invention, a computer program product is provided containing one or more sequences of machine-readable instructions, configured to:

receive a sampling point which has been generated in accordance with any one of the embodiments of the method for determining a sampling scheme as recited above, and control a measurement apparatus to generate measurement data from a semiconductor substrate at a measuring location which corresponds to the sampling point, and determine a model parameter of the first fingerprint model and a model parameter of the second fingerprint model on the basis of at least a part of the generated measurement data.

According to an embodiment of the invention, a computer program product is provided containing one or more sequences of machine-readable instructions, configured to:

receive measurement data which has been from a semiconductor substrate at a measuring location which corresponds to the sampling point which has been determined in accordance with any one of the embodiments of the method for determining a sampling scheme as recited above, and determine a model parameter of the first fingerprint model and a model parameter of the second fingerprint model on the basis of at least a part of the received measurement data, control the application of a pattern on a semiconductor substrate based on the basis of control input data, which control input data is at least partly based on said model parameter of the first fingerprint model and/or the model parameter of the second fingerprint model.

According to an embodiment of the invention, a semiconductor substrate measurement apparatus is provided, which apparatus comprises:

an input terminal which is configured to receive a sampling point which has been determined in accordance with any one of the embodiments of the method for determining a sampling scheme as recited above, and a controller which is configured to control the measurement apparatus to generate measurement data from a semiconductor substrate at a measuring location which corresponds to the sampling point, and a processor which is configured to determine a model parameter of the first fingerprint model and a model parameter of the second fingerprint model on the basis of at least a part of the generated measurement data.

According to an embodiment of the invention, a lithographic apparatus is provided, which apparatus comprises:

an input terminal which is configured to receive measurement data which has been from a semiconductor substrate at a measuring location which corresponds to the sampling point which has been determined in accordance with any one of the embodiments of the method for determining a sampling scheme as recited above, and a processor which is configured to determine a model parameter of the first fingerprint model and a model parameter of the second fingerprint model on the basis of at least a part of the received measurement data, and a controller which is configured to control the application of a pattern on a semiconductor substrate based on the basis of control input data, which control input data is at least partly based on said model parameter of the first fingerprint model and/or the model parameter of the second fingerprint model.

According to an embodiment of the invention, a lithographic system is provided, which system comprises a semiconductor substrate measurement apparatus in accordance with an embodiment as recited above and a lithographic apparatus in accordance with an embodiment as recited above.

According to an embodiment of the invention, a device manufacturing method is provided which comprises transferring a pattern from a patterning device onto a substrate, comprising the step of using a lithographic apparatus an embodiment as recited above.

According to a further embodiment of the invention, a method of generating a sampling scheme for a semiconductor substrate is provided, the method comprising:

a step of identifying at least two fingerprints of a substrate, each fingerprint being associated with a different spatial scale, a step of generating the sampling scheme based on a required accuracy of determining the at least two different fingerprints.

In an embodiment of this method according to the invention, a step of generating the sampling scheme is based on at least two different parameters.

For example, one of the at least two different parameters is a prediction uncertainty of a model. Optionally, the prediction uncertainty of a model is a normalized model uncertainty, G-optimality, least square error, and/or moving standard deviation.

In an embodiment of the method according to the invention, a step of generating the sampling scheme is based on at least two different parameters and the at least two different parameters are not a normalized model uncertainty, G-optimality, least square error, and/or moving standard deviation.

In an embodiment of the method according to the invention, at least one of the at least two different fingerprints is a fingerprint across a substrate, a fingerprint across a field, a fingerprint across a sub-field, a fingerprint across a die, a fingerprint across a set of dies, a fingerprint across a cell, a fingerprint across a set of cells or a subfield of a cell.

In an embodiment of the method according to the invention, the step of generating the sampling scheme is using a model of at least one of the at least two different fingerprints. Optionally, the model is associated with a profile correctable using a lithographic apparatus.

In an embodiment of the method according to the invention, the step of generating the sampling scheme is further based on a drift of at least one of the at least two different fingerprints.

In an embodiment of the method according to the invention, one of the at least two different fingerprints is at least partly associated with substrate context data.

In an embodiment of the method according to the invention, the step of generating the sampling scheme comprises a step of generating at least two sub-sampling schemes for the at least two different fingerprints, and a step of combining the at least two sub-sampling schemes for generating the sampling scheme.

In an embodiment of the method according to the invention, one of the at least two different fingerprints is a fingerprint across an area of a substrate smaller than a minimum dimension associated with a correction potential of a lithographic apparatus.

According to a further embodiment of the invention, a method for determining a sampling scheme in accordance with any one of the embodiments of the method for determining a sampling scheme as recited above is provided, wherein the first fingerprint model or the second fingerprint model is obtained using a method of obtaining a fingerprint model for modelling a spatial distribution of a performance parameter over a portion of a substrate, the method comprising: defining an initial fingerprint model related to the spatial distribution of the performance parameter over the portion as a parameterized combination of basis functions; determining parameter values for the parameterized combination of basis functions based on pre-knowledge, and determining the fingerprint model for modelling the spatial distribution of the performance parameter over the portion of the substrate, based on a measurement set representing the performance parameter over the portion of a set of one or more semiconductor substrates and the initial fingerprint model, whereby a ratio of at least two parameter values of the basis functions as determined in the initial fingerprint model is kept constant or at least part of the shape of the initial fingerprint model is maintained in the fingerprint model.

According to a further embodiment of the invention, a method for determining a sampling scheme in accordance with any one of the embodiments of the method for determining a sampling scheme as recited above is provided, wherein the first fingerprint model is related to the first spatial distribution of the performance parameter over the first portion of the substrate as a parameterized combination of a first set of basis functions, the second fingerprint model is related to the second spatial distribution of the performance parameter over the second portion of the substrate as a parameterized combination of a second set of basis functions, and one or more of the first set of basis functions are substantially orthogonal to one or more of the second set of basis functions.

BRIEF DESCRIPTION OF THE DRAWINGS

Embodiments of the invention will now be described, by way of example only, with reference to the accompanying schematic drawings, in which.

DETAILED DESCRIPTION

Figure 1:
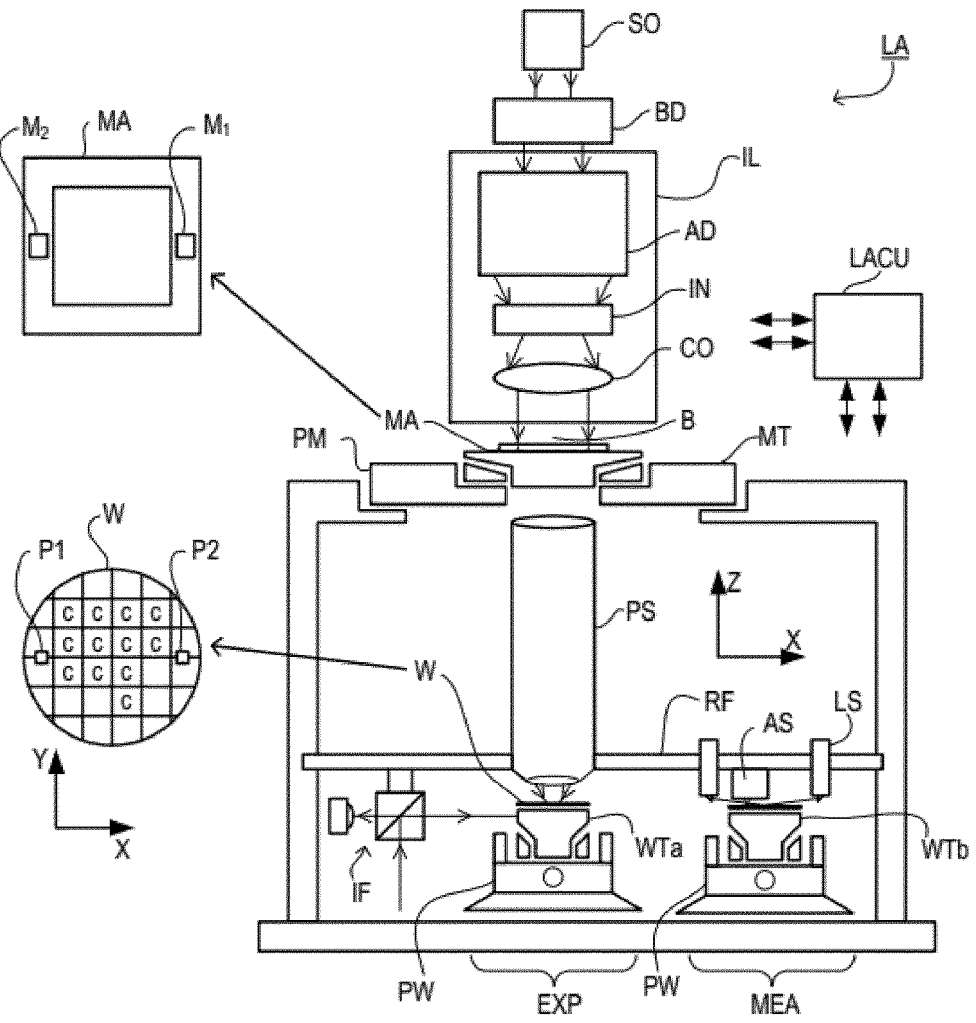
FIG. 1 depicts a lithographic apparatus according to an embodiment of the invention.

FIG. 1 schematically depicts a lithographic apparatus LA according to one embodiment of the invention. The apparatus comprises:

an illumination system (illuminator) IL configured to condition a radiation beam B (e.g. UV radiation or EUV radiation)

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device.".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface of the substrate using a level sensor LS and measuring the position of alignment mark on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. The invention can be applied in apparatus with only one substrate table, or with more than two.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
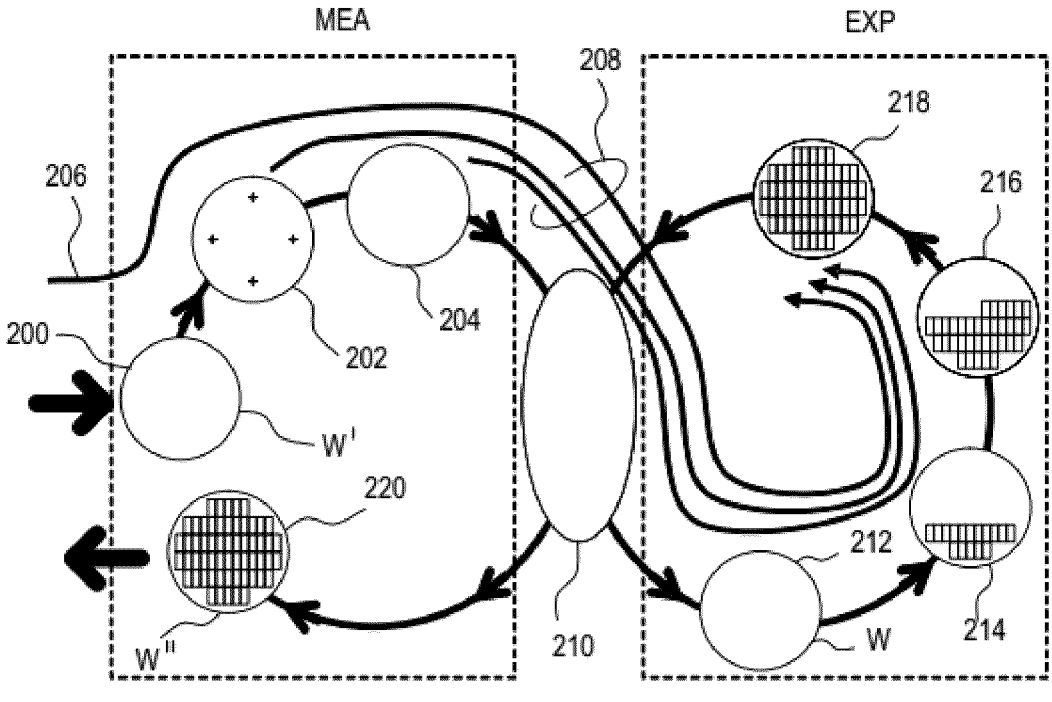
FIG. 2 illustrates schematically the stages in the measurement and exposure processes in the apparatus of FIG. 1, according to known practice.

FIG. 2 illustrates the known steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus. Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured, to establish a "wafer grid", which maps very accurately the distribution of marks across the substrate, including any distortion relative to a nominal rectangular grid. At step 204, a map of substrate height against X-Y position is measured also, for use in accurate focusing of the exposed pattern.

When substrate W' was loaded, recipe data 206 were received, defining the exposures to be performed, and also properties of the substrate and the patterns previously made and to be made upon it. To these recipe data are added the measurements of substrate position, substrate grid and height map that were made at 202, 204, so that a complete set of recipe and measurement data 208 can be passed to the exposure stage. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further below, advanced models are known that use more parameters.

At 210, substrates W' and W are swapped, so that the measured substrate W' becomes the substrate W entering the exposure station EXP. This swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns. By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Figure 5:
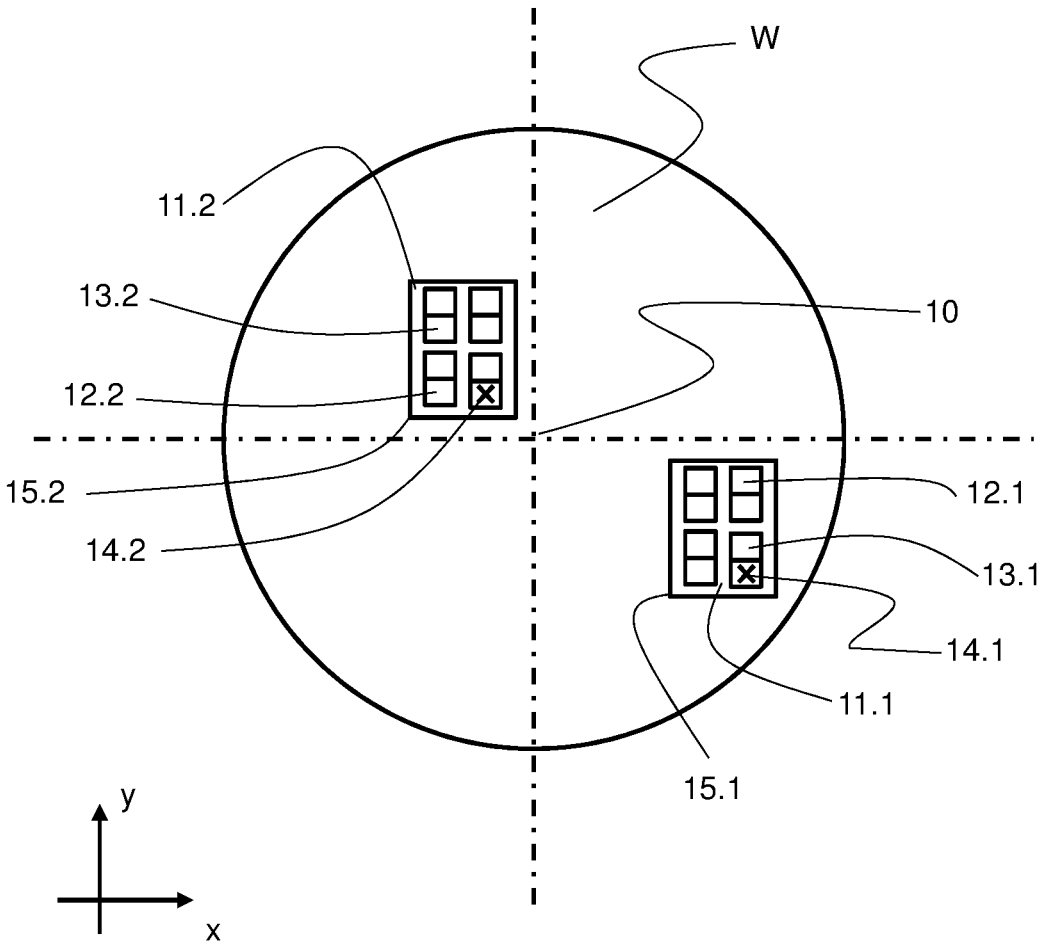

FIG. 5 schematically shows a semiconductor substrate W. The semiconductor substrate W has a generally circular shape with a center 10.

The semiconductor substrate W (or "substrate W" for short) contains a plurality of fields 11.1, 11.2, of which 2 are schematically indicated in FIG. 5. A field is for example the area of the substrate W which is irradiated between subsequent moves of the stage relative to the projection system. In this example, each field 11.1, 11.2 is formed by multiple dies 12.1, 12.2, which are also schematically indicated in FIG. 5. So, in this example, a die is smaller than a field. After processing the substrate, the dies will form the individual microchips. In another example, a die may comprise multiple fields. So in that example, a die is larger than a field. Each die optionally contains multiple cells 13.1, 13.2, which are also schematically indicated in FIG. 5. So, a cell is an area within a die. A cell is smaller than a die. FIG. 5 shows two fields 11.1, 11.2. In FIG. 5, each field contains four dies, e.g. 12.1,12.2. In FIG. 5, each die contains two cells, e.g. 13.1, 13.2. The number of fields, dies, and cells may be different.

The value of a performance parameter may vary with the position of a point 14.1, 14.2 on the substrate W, e.g. the radial distance from the point to the center 10 of the substrate W. In some cases, it is known this variation can be described by means of a mathematical model, e.g. a polynomial, but the model parameters may vary between individual substrates W.

For example, it can be known that the value of a performance parameter at a point 14.1. 14.2 is dependent from the radial distance to the center 10 of the substrate, and that the value follows a parabolic curve. The mathematical model to describe the parameter value is then a second order polynomial, which can be written as: $p1=aR^2+bR+c$, in which p1 represents the value of the performance parameter P in relation to the substrate W, R is the radial distance of a point to center 10 of the substrate W and a, b, and c are model parameters. The mathematical model may or may not include periodicity. An example of a mathematical model which includes periodicity is a sine wave.

The model parameters for each individual substrate can be determined by carrying out measurements at sample points. The sample points are locations on the substrate W at which measurements are performed with the aim of providing measurement data from which the model parameters a, b, and c can be determined. A plurality of sampling points together forms a sampling scheme. Once model parameters a, b and c are determined, the distribution of the performance parameter can be predicted for locations where the measurements were not performed and thus the performance parameter measurement data can be densified. The densified performance parameter measurement data can be used to control the lithographic apparatus with an increased accuracy, because the knowledge of the values of the densified performance parameter measurement data and/or the model parameters of the model for the performance parameter allows to compensate for errors or other deviations.

If the sampling scheme contains a large number of sampling points, the performance parameter distribution can be determined accurately. However, it takes a long time to perform the measurements that are necessary to determine the model parameters, which reduces the throughput of the lithographic process. Therefore, it is advantageous if the number of sampling points in a sampling scheme can be reduced.

The value of a performance parameter may not only vary with the position of a point 14.1, 14.2 on the substrate W, but also with the position of that point 14.1, 14.2 within a field 11.1, 11.2, die 12.1, 12.2 or cell 13.1, 13.2, for example with the distance in x-direction or in y-direction from a corner 15.1, 15.1 of the field 11.1, 11.2 in which the point 14.1, 14.2 is located. The mathematical model describing the variation of the value of the performance parameter may be the same as or different from the mathematical model that describes the variation of that performance parameter over the surface of the substrate face as a whole. For example, the variation of the performance parameter within a field 11.1, 11.2 as dependent on the distance in x-direction from corner point 15.1, 15.2 of that field 11.1, 11.2 can be written as: p2=fY+g, wherein p2 represents the value of performance parameter P in relation to the field 11.1, 11.2, Y is the distance in y-direction from the point 14.1, 14.2 to the corner point 15.1, 15.2 of the respective field 11.1, 11.2, and f and g are model parameters.

When considering the points 14.1 and 14.2 as depicted in FIG. 5, the value of performance parameter P, which is dependent from the position of the point 14.1, 14.2 on the substrate W in general will be different between point 14.1 and point 14.2, because these points are located at a different radial distance from the center 10 of the substrate W. However, the value of the performance parameter P will be the same or at least similar for points 14.1 and 14.2 as they are located at the same distance in y-direction from the corner points 15.1, 15.2 of their respective field 11.1, 11.2. Taking these considerations into account in the control of process in the lithographic apparatus (e.g. in the control of the movement of the substrate relative to a projection system of the lithographic apparatus) can help to increase the accuracy of the lithographic process.

The spatial distribution of a performance parameter over the semiconductor substrate or a part thereof (i.e. the variation of the value of a performance parameter over the semiconductor substrate or a part thereof) is called a "fingerprint". The fingerprint may also vary over time due to e.g. process changes over time. The fingerprint model is a mathematical model that models the fingerprint over the substrate W or a part of the substrate W. The fingerprint model contains a number of model parameters (e.g. the parameters a, b, c, f and g in the examples given above). The same fingerprint model may be used for a group of substrates W, e.g. the substrates W of one or more lots, or even all substrates W which are processed on the same lithographic apparatus. However, the model parameters may vary from individual substrate W to individual substrate W.

Figures 6A, 6B:
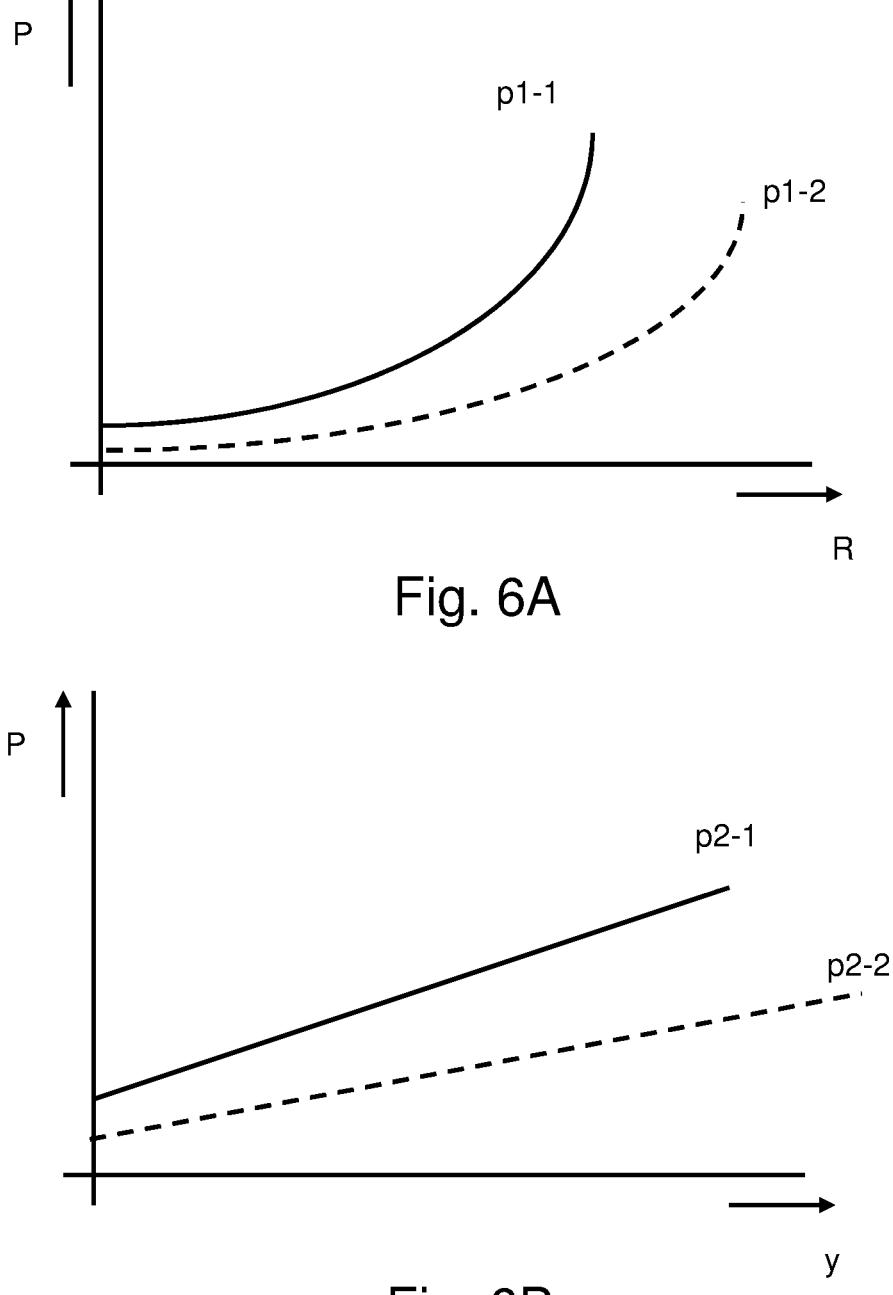

FIGS. 6A and 6B illustrate this. FIG. 6A shows a graph representing the value p1 of performance parameter P as dependent on the radial distance R from the center 10 of the substrate. Line p1-1 represents the variation of the value of P in a first substrate, and line p1-2 represents the variation of the value of P in a second substrate. While the shape of the lines p1-1, p1-2 can be described by the same kind of polynomial (the "fingerprint model"), the parameters of that polynomial vary between lines p1-1 and p1-2. For example, if the polynomial representing both lines p1-1 and p1-2 can be written as $aR^2+bR+c$, the values for the model parameters a, b and c are different for line p1-1 and line p1-2.

FIG. 6B shows a graph representing the value p2 of performance parameter P as dependent on the distance in y-direction Y from the corner 15.1, 15.2 of a filed 11.1, 11.2. Line p2-1 represents the variation of the value of P in a first substrate, and line p2-2 represents the variation of the value of P in a second substrate. While the shape of the lines p2-1, p2-2 can be described by the same kind of polynomial (the "fingerprint model"), the parameters of that polynomial vary between lines p2-1 and p2-2. For example, if the polynomial representing both lines p1-1 and p1-2 can be written as fY+g, the values for the model parameters f and g are different for line p2-1 and line p2-2.

A fingerprint model is for example obtained by first obtaining the fingerprint and then transforming the obtained fingerprint into a mathematical model that is representative of the obtained fingerprint. The fingerprint can for example be obtained by measuring the performance parameter in a semiconductor substrate or a group of semiconductor substrates at plurality of measuring locations. In general, to obtain the fingerprints, measurements must be performed at a high number of measuring locations. Alternatively or in addition, the fingerprint may be obtained by simulating the performance parameter in a computer model, and obtaining the spatial distribution of the value of that performance parameter over the semiconductor substrate or a part thereof.

From the obtained fingerprint, the fingerprint model can for example be obtained by the determination of a pattern in the spatial distribution of the measured performance parameter, e.g. by curve fitting. For example, WO2013/092106 described is paragraphs [0108]-[0129] how a correction model can be applied to measured data in order to calculate model parameters. So, the fingerprint model is a mathematical model which is determined based on the domain knowledge. Then, measurements are performed at sampling locations. The fingerprint model comprising the model parameters are fitted to the measurements. Then the model parameters are determined by the fitting. The fitted fingerprint model (i.e. the fingerprint model with the model parameters fitted to the measurement data) can predict the performance parameter value at any locations on the substrate W, typically at locations where no measurements were performed. In this way, the fitted fingerprint model enables to "model" or "densify" the measurements across the entire substrate W while keeping the number of measurements reasonably low. This allows to obtain a good balance between throughput and accuracy.

The control architecture of a lithographic apparatus is configured to control the performance (overlay, CD, focus for example) at both intra-field level and inter-field level. Recent developments (WO 2016146217 A1, WO 2018121921 A1) enabled also control at spatial scales smaller than a field. The control architecture of state of the art scanners also allows control at sub-field level. The definition of the sub-field regarding its size and/or shape may be chosen in line with the spatial variation of the performance parameter(s), typically depending on the layout of the fields, dies and cells across the substrate. The sub-field based control architecture provides enhanced flexibility of control to the lithographic apparatus. For example, a particular layout (distribution) of die/cells across a field may cause a corresponding stress distribution within the field which causes in-plane wafer deformation of the field inducing a corresponding fingerprint of a performance parameter (error) fingerprint. In case the stress distribution is periodic the fingerprint may show a a repetitive (periodic) pattern across the field. This kind of fingerprint may be efficiently corrected by the lithographic apparatus in case a sub-field based control interface is available, wherein the sub-field is defined to cover a single or discrete number of periods comprised within the repetitive patterns so that fingerprint corrections per sub-field are typically substantially identical (e.g. each correction targeted to correct the same periodic performance parameter fingerprint).

When fingerprints at different spatial scales, e.g. a whole substrate and a field, a field and a sub-field, etc., are identified, it is beneficial to correct these fingerprints by controlling the lithographic apparatus based on the identified fingerprints.

The objective of this invention is to obtain a sampling scheme that enables modelling two or more fingerprints at different spatial scales accurately while preventing the number of measurements required to identify the model parameters to be too large.

The model parameters of a fingerprint model may be determined based on a (normalized) model uncertainty. For example, WO 2015110191 A1 and WO 2016162231 A1 describe the method. When noise is present in data, the data may be modeled in different manners depending on the nature of the noise, the measurement (e.g., sampling) scheme used, etc. So, the model uncertainty provides a measure of noise sensitivity for a mathematical model when its parameters are estimated on a given metrology scheme using noisy measurements. Thus, the model uncertainty can be interpreted as a noise amplification/suppression factor from noise present in measurements to variations in model predicted values. The model uncertainty is a function of the mathematical model used, the location of measurement points, the location where the model is evaluated (interpolation extrapolation) and the number of substrates measured. The normalized model uncertainty (NMU) is a unitless version of model uncertainty and doesn't change as a function of noise level. NMU<1 implies noise suppression and NMU>1 implies noise amplification. Thus, the normalized model uncertainty indicates the amount of variation in modeled values scaled with the amount of noise in the measurements. A low NMU (<1) helps ensure that a sampling scheme—mathematical model combination will lead to a consistent fit, i.e. a fit robust to noise (although it may not be a guarantee that the model will accurately describe actual measurements). In an embodiment, the maximum NMU should be less than 0.6, less than 0.5, less than 0.4, or less than 0.3 for good noise suppression. The product of the within-substrate noise (e.g., the 3 sigma value) and the NMU is the within-substrate-noise-based output noise (e.g., remaining noise). It is a theoretical output noise and is an indicator that shows the effect of the chosen model and the used sample scheme. Thus, in an embodiment, the sampling scheme optimizer may optimize to reduce or minimize NMU and then remaining uncertainty for further use in evaluation of one or more mathematical models and sampling schemes in view of the measured data may be determined by multiplying the applicable NMU values times the within-substrate noise (e.g., the 3 sigma value) of the measured data.

A sampling scheme for determining the location of the sampling points to obtain measurements of the performance parameters to determine the model parameters of two or more fingerprint models may be determined based on the (normalized) model uncertainty of the fingerprint models. The sampling scheme may be determined to co-optimize to reduce or minimize NMUs of the two or more fingerprint models at the same time. The sampling scheme determined in this way provides the locations of the sampling points which are useful to determine the model parameters of the two or more fingerprints with minimized or reduced model uncertainty.

In an embodiment of the invention, a sampling scheme is determined by obtaining a first fingerprint model relating to a first spatial distribution of a performance parameter over a first portion of a semiconductor substrate and a second fingerprint model relating to a second spatial distribution of said performance parameter over a second portion of the semiconductor substrate, and by determining sampling point corresponding to a measuring location on the semiconductor substrate for generating measurement data based on an expected reduction of a first uncertainty metric associated with evaluation of the first fingerprint model over the first portion and an expected reduction of a second uncertainty metric associated with evaluation of the second fingerprint model over the second portion. The number of fingerprint model may be more than two, e.g. three, four or higher.

In an embodiment of the invention, a sampling scheme is further determined by obtaining a third fingerprint model relating to a third spatial distribution of said performance parameter over a third portion of the semiconductor substrate, wherein determining the sampling point corresponding to the measuring location on the semiconductor substrate for generating measurement data is further based on an expected reduction of a third uncertainty metric associated with evaluation of the third fingerprint model over the third portion.

In an embodiment of the invention, a sampling scheme is further determined by obtaining a fourth fingerprint model relating to a fourth spatial distribution of said performance parameter over a fourth portion of the semiconductor substrate, wherein determining the sampling point corresponding to the measuring location on the semiconductor substrate for generating measurement data is further based on an expected reduction of a fourth uncertainty metric associated with evaluation of the fourth fingerprint model over the third portion.

A single sampling point which has been determined in accordance with this embodiment, can be used to derive a model parameter of both the first and the second fingerprint model. Therewith, the number of measurements that has to be performed in order to obtain the model parameters can be reduced.

Not all possible measurement locations on the substrate W provide useful information for both fingerprint models. For example, if the fingerprint model is a periodic function, a location in which the performance parameter is zero does not provide information about the peak height of the periodic function. A further measurement, at a different location, is necessary to obtain this information. In accordance with an embodiment, only locations which provide useful information on both the first and the second fingerprint model qualify as sampling points.

These measurement locations which qualify as sampling point can be determined in various ways.

For example, initially a first fingerprint model and a second fingerprint model are determined on the basis of measurements which are carried out at a large number of locations on a sample substrate W. So, a large number of sampling points is included in this measurement. The model parameters of the first and second fingerprint of the sample substrate are determined on the basis of this large number of measurements. Then, e.g. by numerical or other computer implemented approaches, the model parameters of the first and second fingerprint models are again determined, but now on the basis of measurements which are carried out at a lesser number of sampling points. Then it is checked whether the deviation between the initial run (with all sampling points) and the second run (with lesser sampling points) is acceptable or not. If not, too many or too many important sampling points were left out at the second run. If the deviation is acceptable, maybe even more sampling points can be left out. This way, the sampling scheme can be optimized so that all or at least most of the sampling points allow to determine a model parameter of the first fingerprint model and a model parameter of the second fingerprint model.

Another optimization method, which can be used in addition to or as an alternative to the method as described in the previous paragraph, is to check the effect of leaving out or changing the measurement values of a point, and determine what there effect of this is on the model parameters that were initially determined on the basis of the first run (so, using the large number of sampling points). If a significant effect is present on both a model parameter of the first fingerprint model as well as on a model parameter of the second fingerprint model, this is a sampling point which qualifies as a sampling point for carrying out an embodiment of the current invention.

Other additional or alternative methods are possible as well.

Optionally, the first fingerprint model is a global fingerprint model and the second fingerprint model is a local fingerprint model.

For example, the first portion of the substrate to which the first fingerprint model pertains, is the top face of the substrate W (i.e. the portion of the top face to the substrate W that is to be or has been irradiated, not including any focus exclusion areas in case these are present), and the second portion of the substrate W to which second fingerprint model pertains is for example a field.

Alternatively, for example, the first portion of the substrate to which the first fingerprint model pertains, is the top face of the substrate W (i.e. the portion of the top face to the substrate W that is to be or has been irradiated, not including any focus exclusion areas in case these are present), and the second portion of the substrate W to which second fingerprint model pertains is for example a die.

Alternatively, for example, the first portion of the substrate to which the first fingerprint model pertains, is the top face of the substrate W (i.e. the portion of the top face to the substrate W that is to be or has been irradiated, not including any focus exclusion areas in case these are present), and the second portion of the substrate W to which second fingerprint model pertains is for example a cell.

Alternatively, for example, the first fingerprint model or the second fingerprint model is a lithographic apparatus correction capability model.

The lithographic apparatus correction capability model may be a model that describes correction capabilities that a lithographic apparatus can apply to the substrate. For example, intra-die fingerprints may be more difficult to correct than slowly varying full wafer fingerprint. By using such a lithographic apparatus correction capability model as the first or the second fingerprint model, the sampling point to be determined according to this invention can identify only fingerprint components that can be corrected by the lithographic apparatus. This enable the selection of the sampling location to be more effective as the sampling location chosen this way does only identify the fingerprint components that are correctable by the lithographic apparatus and does not identify other fingerprint components that are not correctable by the lithographic apparatus.

Alternatively, for example, the first fingerprint model and/or the second fingerprint model may be a physical model. The physical model may be, for example, a stress profile model or any other process models.

For example, the stress profile model may be a model describing the stress distribution over the substrate or part of the substrate, e.g. a field, a sub-field, a die, a cell, or a plurality of fields, sub-fields, dies, cells. When a certain semiconductor manufacturing process, e.g. coating, baking, CMP, development or etching, introduces a stress distribution on part or whole of the substrate, the corresponding fingerprint caused by the stress is effectively identified by measurements taking at the sampling locations determined by this invention wherein at least one of the first and/or second fingerprint models is the stress profile model. In similar manners, any other types of fingerprint components induced by a semiconductor manufacturing process may be identified by this invention with the first and/or second fingerprint model being a process model corresponding to the semiconductor manufacturing process model.

Alternatively, for example, the first fingerprint model and/or the second fingerprint model are associated with a process fingerprint.

For example, the first and/or second fingerprint model may be associated with a process fingerprint on part or whole of the substrate induced by a semiconductor manufacturing process. The process fingerprint is effectively identified by measurements taking at the sampling locations determined by this invention wherein the first and/or second fingerprint models are associated with the process fingerprint. The process fingerprint may, for example, be represented by a Non-Zero Offset between After Development Inspection (ADI) of overlay errors and After Etch Inspection (AEI) overlay errors measured on the substrate(s) of the same/different wafer(s) or lot(s).

Alternatively, for example, the first portion of the substrate to which the first fingerprint model pertains, is a field of the substrate W, and the second portion of the substrate W to which second fingerprint model pertains is for example a die.

Alternatively, for example, the first portion of the substrate to which the first fingerprint model pertains, is a field of the substrate W, and the second portion of the substrate W to which second fingerprint model pertains is for example a cell.

Alternatively, for example, the first portion of the substrate to which the first fingerprint model pertains, is a die of the substrate W, and the second portion of the substrate W to which second fingerprint model pertains is for example a cell.

Alternatively, for example, the first portion of the substrate to which the first fingerprint model pertains, is a field of the substrate W, and the second portion of the substrate W to which second fingerprint model pertains is for example a sub-field.

Alternatively, for example, the first fingerprint model is configured to describe behaviour of a performance parameter across the inner part of the substrate and the second fingerprint model is configured to describe the behaviour of the performance parameter at the edge of the substrate.

Optionally, the first portion and the second portion at least partly overlap with each other.

Optionally, the first portion and/or the second portion is at least a part of an irradiated layer inside the semiconductor substrate or at the top surface of the semiconductor substrate.

Optionally, the second portion is one of a field, a plurality of fields, a subfield, plurality of subfields, a die, a plurality of dies, a part of a die, a plurality of parts of dies, a cell, a plurality of cells, a part of a cell, or a plurality of parts of cells.

Optionally, the first fingerprint model is a global model and the second portion is one of a field, a plurality of fields, a subfield, plurality of subfields, a die, a plurality of dies, a part of a die, a plurality of parts of dies, a cell, a plurality of cells, a part of a cell, or a plurality of parts of cells. Even further optionally.

Optionally, the first portion is the top face of the substrate W (i.e. the portion of the top face to the substrate W that is to be or has been irradiated, not including any focus exclusion areas in case these are present), and the second portion is one of a field, a plurality of fields, a subfield, plurality of subfields, a die, a plurality of dies, a part of a die, a plurality of parts of dies, a cell, a plurality of cells, a part of a cell, or a plurality of parts of cells.

Optionally, the first portion is a plurality of fields, and the second portion is one of a field, a subfield, plurality of subfields, a die, a plurality of dies, a part of a die, a plurality of parts of dies, a cell, a plurality of cells, a part of a cell, or a plurality of parts of cells.

Optionally, the first portion is a field, and the second portion is one of a subfield, plurality of subfields, a die, a plurality of dies, a part of a die, a plurality of parts of dies, a cell, a plurality of cells, a part of a cell, or a plurality of parts of cells.

Optionally, the first portion is a plurality of subfields, and the second portion is one of a subfield, a die, a plurality of dies, a part of a die, a plurality of parts of dies, a cell, a plurality of cells, a part of a cell, or a plurality of parts of cells.

Optionally, the first portion is a subfield, and the second portion is one of a die, a plurality of dies, a part of a die, a plurality of parts of dies, a cell, a plurality of cells, a part of a cell, or a plurality of parts of cells.

Optionally, the first portion is a plurality of dies, and the second portion is one of a die, a part of a die, a plurality of parts of dies, a cell, a plurality of cells, a part of a cell, or a plurality of parts of cells.

Optionally, the first portion is a die, and the second portion is one of a part of a die, a plurality of parts of dies, a cell, a plurality of cells, a part of a cell, or a plurality of parts of cells.

Optionally, the first portion is a plurality of parts of dies, and the second portion is one of a cell, a plurality of cells, a part of a cell, or a plurality of parts of cells.

Optionally, the first portion is a plurality of cells, and the second portion is one of a cell, a part of a cell, or a plurality of parts of cells.

Optionally, the first portion is a cell, and the second portion is one of a part of a cell, or a plurality of parts of cells.

Optionally, the first portion is a plurality of parts of cells, and the second portion is a part of a cell.

The first portion and the second portion have a larger area than a sampling point has.

Optionally, the first fingerprint model is a global model, the second fingerprint model is a substrate edge model, the third portion is a field, and the fourth portion is a sub-field.

The performance parameter is for example an overlay error, critical dimension (e.g. line width), alignment parameter (alignment mark position), side wall angle, edge roughness, edge placement error, and/or focus (error).

Optionally, the first fingerprint model and/or the second fingerprint model further relate to the spatial distribution of at least one further parameter.

For example, at least one further parameter is a prediction uncertainty of a model, e.g. a normalized model uncertainty, G-optimality, least square error and/or moving standard deviation.

In addition to providing a method of establishing a sampling scheme, an aspect of the present invention is about establishing or determining a suitable model for modelling the performance parameter. In general, a fingerprint of a performance parameter, or more particular a fingerprint model of the performance parameter, can be defined by a combination of basis shapes or functions. Such basis shapes or functions can e.g. include polynomials, or splines or other mathematical functions. In general, modelling a measured phenomenon along a trajectory or across an area may involve determining the best fit of a linear or non-linear combination, e.g. a weighted combination, of the basis shapes of functions along the trajectory or across the area. As will be understood, the more basis shapes are considered to be involved in the fitting, the more measurement data needs to be available. If one e.g. wants to fit a fifth order polynomial through a set of measurements representing a performance parameter P measured along an X-direction, there are 6 variables that need to be determined, i.e. $p0$-$p5$:

$$P=p0+p1 \cdot x+p2 \cdot x^2+p3 \cdot x^3+p4 \cdot x^4+p5 \cdot x^5 \tag{1}$$

In a similar manner, the performance parameter may be modelled using a set of spline functions $C_i$:

$$P=p1 \cdot C_1+p2 \cdot C_2+p2 \cdot C_3 \tag{2}$$

In case a large number of basis shapes or functions are involved in the fitting process, it may thus require at least an equal large number of measurements, in order to determine the variables or parameters of the applied model. Note that the variables or parameters applied to achieve the fitting of the fingerprint model to the measured data may also be referred to as weight factors. The fitting of a model or fingerprint model which comprises a combination of basis shapes or functions thus corresponds to determining a weighted combination of the basis shapes or functions that corresponds as good as possible to the measured set of data.

The weighted combination of basis shapes may then be referred to as the fingerprint model of the measured data, e.g. a fingerprint model or fingerprint of a particular performance parameter such as an overlay error, critical dimension, side wall angle, etc. . . . .

With respect to the modelling or setting up the model, it can be pointed out that the use of a large number of basis functions provides a large fitting freedom, i.e. it allows a model to be tuned to a large variety of shapes, but it has the drawback of creating some complexity in setting up the model since it required the determination of a large number of variables, parameters or weight factors.

It will be appreciated that, in case the fingerprint model describes a performance parameter of a subfield of a substrate, it may thus require a large number of measurements to determine the fingerprint model of each subfield of the substrate. Requiring a large number of measurements to determine a model may also add to the noise sensitivity.

In an embodiment of the present invention, an approach is proposed to reduce the number of measurements required to obtain the fingerprint model of a number of fields or subfields of a substrate. The proposed approach is based on the insight that, although a performance parameter P over a subfield of a substrate may be different for each subfield, the overall shape of the performance parameter in different subfields may show a strong resemblance. As such, it has been devised by the inventors that it may be sufficient to, at least partially, maintain a previously determined fingerprint model, e.g. a fingerprint model of a particular subfield, to derive a fingerprint model for another subfield.

In such embodiment, one may thus, rather than fitting an entire new model, i.e. a model of which all variables or weight factors are yet to be determined, maintain or preserve certain aspects of a previously determined model, referred to as an initial fingerprint model, thereby reducing the number of variables that need to be determined for the new model.

This can be illustrated as follows:

Referring to the above mentioned $5^{th}$ order polynomial fitting, it is assumed that, for a particular subfield S0 of a substrate, the fitting has been performed and results in a model or fingerprint for said subfield which can be described as:

$$P(S0)=a0+a1\cdot x+a2\cdot x^2+a3\cdot x^3+a4\cdot x^4+a5\cdot x^5 \qquad (3)$$

Whereby a0, a1, a2, a3, a4 and a5 are now fixed parameters resulting in an optimal fitting of the performance parameter P as measured over subfield S0. Subfield S0 may e.g. be referred to as a reference subfield that is used to determine the fitting parameters of the model of equation (1), resulting in the fingerprint model P(S0), which may be referred to as an initial fingerprint model or reference fingerprint model for modelling a performance parameter P over a subfield of a substrate.

In accordance with an embodiment of the present invention, a fingerprint model for the performance parameter P for another subfield, e.g. subfield S1, may now be determined as:

$$P(S1)=p_S\cdot(a0+a1\cdot x+a2\cdot x^2+a3\cdot x^3+a4\cdot x^4+a5\cdot x^5) \qquad (4)$$

Whereby $p_S$ is a variable or parameter that is to be determined to obtain an optimal fit of the model (a0+a1·x+a2·x²+a3·x³+a4·x⁴+a5·x⁵) to the measurements of the performance parameter P of the subfield S1. $p_S$ is also referred to as a shape parameter in this document.

In the example as given, the shape of the model used for modelling the performance parameter P of the subfield S1 is fixed, only the amplitude of the model can be varied, via the variable $p_S$, which can be determined, by fitting the model of equation (4) to measurement data of the performance parameter P in the subfield S1. Expressed in a more mathematical manner, one can observe that by fixing the parameters a0-a5 of the initial fingerprint model, the ratio between the different basis functions of the model is fixed, or the relative weight of the different basis functions used is fixed, or is kept constant. By doing so, the shape of the fingerprint model is fixed or maintained.

As will be appreciated by the skilled person, since the fingerprint model P(S1), in particular the shape of the model, for subfield S1 is substantially fixed, apart from the amplitude, there is no need to have a large measurement data set for the fitting of the model. As can be seen in the example given, only one variable $p_S$ needs to be determined, in order to fully determine the fingerprint model for the subfield S1. In principle, it would be sufficient to have one measurement of the performance parameter performed on the subfield S1, in order to determine the shape parameter or variable $p_S$.

In the example given, the shape of the model as applied is thus substantially fixed, such that only the amplitude of the fingerprint model representing the performance parameter P can be varied or modelled for a particular subfield.

Such a fingerprint model as developed by the above described process may be advantageously applied in case it is observed that measured performance parameters, e.g. measured overlay errors, substantially have the same shape across different subfields.

In case it is observed that the actual shape of a fingerprint or model representing an performance parameter across a subfield would not remain substantially constant over a substrate, it may be required to introduce additional flexibility or variability in the fingerprint model as applied. In such case, one can, rather than entirely fixing or freezing the shape of the model as applied, allow for the shape to be varied as well, albeit more limited than using the general model according to equation (1).

Examples of such models whereby the shape of the model is not entirely fixed but can be varied to some extend are:

$$P(S1)=p_{S1}\cdot(a0+a1\cdot x+a2\cdot x^2)+p_{S2}\cdot(a3\cdot x^3+a4\cdot x^4+a5\cdot x^5)$$

$$P(S1)=p_{S1}\cdot(a0+a1\cdot x+p_{S2}\cdot a2\cdot x^2+a3\cdot x^3+a4\cdot x^4+a5\cdot x^5)$$

$$P(S1)=p_{S1}\cdot(a0+a1\cdot x+a2\cdot x^2+a3\cdot x^3+a4\cdot x^4)+p_{S2}\cdot x^5 \qquad (5)$$

In the top equation of eq. (5), it can be observed that the relative weight of the $0^{th}$ order, the $1^{st}$ order and the $2^{nd}$ order basis functions is fixed or kept constant, as well as the relative weight of the $3^{th}$ order, the $4^{th}$ order and the $5^{th}$ order basis functions. By doing so, the number of shape parameters or variables $p_{Si}$ to be determined is reduced from 6 to 2. In general, it can be mentioned that by fixing the relative weight of two of the basis functions as applied, or keeping the ratio of the two basis functions constant, one can eliminate one variable or parameter that needs to be determined.

In a similar manner, a model or fingerprint that is based on spline functions, can be determined for a particular subfield, whereupon the model can be used for modelling other subfield, there maintaining or fixing the shape of the model to a certain extend.

In such embodiment, a fingerprint or model for a particular subfield S0 of a substrate can be determined by performing a plurality of measurement across the subfield, and resulting in a model or fingerprint for said subfield S0 which can be described as:

$$P(S0)=a1\cdot C_1+a2\cdot C_2+a2\cdot C_3 \qquad (6)$$

Whereby a1, a2 and a3 are now fixed parameters resulting in an optimal fitting of the performance parameter P as measured over subfield S0.

In accordance with an embodiment of the present invention, a model for an performance parameter P for a subfield S1 may now be determined as:

$$P(S1)=p_S\cdot(a1\cdot C_1+a2\cdot C_2+a2\cdot C_3) \qquad (7)$$

Whereby $p_S$ is a variable that is to be determined to obtain an optimal fit of the model (a1·$C_1$+a2·$C_2$+a2·$C_3$) to the measurements of the performance parameter P of the subfield S1.

In the example given by eq. 7, the shape of the model is substantially fixed, as such only the amplitude of the applied model is considered a variable when modelling another subfield, e.g. subfield S1.

In a similar manner as discussed for the polynomial model, a model based on spline functions may also be adapted to take account of certain variations of the model across the substrate. In case it is observed that the actual shape of a fingerprint or model representing an performance parameter across a subfield would not remain substantially constant over a substrate, one may thus introduce additional flexibility or variability in the model as applied. In such case, one can, rather than entirely fixing or freezing the shape of the model as applied, allow for the shape to be varied as well, albeit more limited than using the general model according to equation (1).

Examples of such models based on spline functions whereby the shape of the model is not entirely fixed but can be varies to some extend are:

$$P(S1)=p_{S1}\cdot(a1\cdot C_1 + p_{S2}\cdot a2\cdot C_2 + a2\cdot C_3)$$

$$P(S1)=p_{S1}\cdot(a1\cdot C_1 + a2\cdot C_2) + p_{S2}\cdot C_3 \qquad (8)$$

Both for the polynomial model and the spline function based model, or other models defined as a combination, either linear or non-linear, of basis functions, the process of modelling a performance parameter for a plurality of sub-fields on a substrate may thus start by determining the model or fingerprint for a particular subfield or a set of particular subfield. In an embodiment of the present invention, a collection of reference subfields is used, which can be measured over multiple locations on a substrate and/or measured over multiple substrates. The measurements over the multiple subfields may then be averaged. In an embodiment, the reference subfields are selected in such manner that they provide a good representation of the expected shape. Since this initial fingerprint needs only be determined once, and it is used, to a large extend for the modelling of other subfields, it may be worth to perform a detailed measurement of the fingerprint, or performance parameter, across the subfield. This initial fingerprint or reference fingerprint may e.g. be determined during an initial setup phase using available measurement data such as training and validation data.

Figure 7:
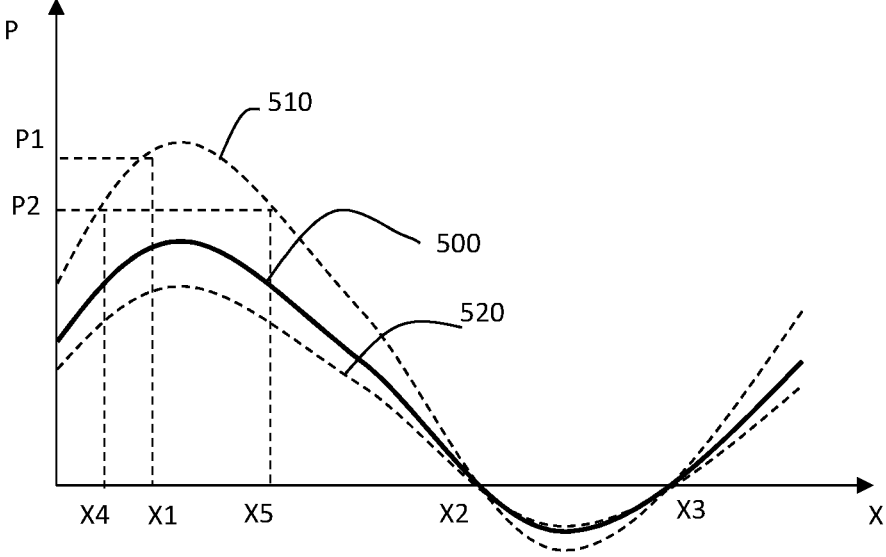

Once the initial or reference fingerprint or fingerprint model has been determined, it can be used to determine the fingerprint model of another subfield, which would then only require a limited set of measurements, in view of the constraint of maintaining or fixing at least part of the shape of the initial fingerprint model in the fingerprint model for other subfields This process is illustrated in FIG. 7. FIG. 7 schematically shows a fingerprint 500 describing an performance parameter P across a subfield, e.g. along an X-direction, as determined based on measurements performed on the subfield.

Fingerprint 500 may thus be considered to be a reference fingerprint, the shape of which is considered to correspond to the shape of the fingerprint of other subfields as well. As such, assuming that the fingerprint of another subfield of the substrate will have substantially the same shape, a fingerprint of another subfield may e.g. correspond to a graph 510 or a graph 520, graphs 510 and 520 only differing in amplitude from the reference fingerprint. As will be appreciated by the skilled person, in order to determine the actual fingerprint for a subfield, whereby the shape of the fingerprint is predetermined, one would only need to perform one measurement. Referring to FIG. 7, it would be sufficient to know the actual amplitude of the fingerprint model at a particular location, e.g. amplitude P1 at x=x1 and to scale the fingerprint 500 such that it includes the measured value P1 at x=x1.

Because only a limited set of measurements is needed to determine the actual fingerprint of a subfield, it is important to ensure the selected measurements provide sufficient information, or preferably provide the most relevant information, to determine the actual fingerprint of a subfield. As an example, it may be preferred to sample or measure the subfield performance parameter at a location where a comparatively high amplitude of the performance parameter is expected. Performing the measurement at such a location may e.g. correspond to a location where the signal-to-noise ratio is low. In contrast, when the measurement is performed at a location where a low amplitude of the performance parameter is expected, the accuracy at which the fingerprint can be determined may be small. For the example given in FIG. 7, it is clear that performing measurement near x=x2 or x=x3 will not render an informative measurement regarding the amplitude of the fingerprint that is looked for.

In order to mitigate effects of noise or to include some form of redundancy in the measurements, it may be advisable to perform more measurements than strictly required. Performing additional measurements also offers the possibility to check whether or not the predetermined shape of the fingerprint 500 is valid or is still valid. Redundant measurements thus offer the possibility to detect whether the predetermined shape of the fingerprint is still valid or should be adjusted. Referring to FIG. 7, it can be observed that for the fingerprint model 500, measurements taken at x=x4 and x=x5 render the same performance parameter P2. As such, when measurements are performed on another subfield at locations x=x4 and x=x5, one expects to obtain the same performance parameter measurement. In case such measurements would result in a different value, this can be considered an indication that the shape of the other subfield does not correspond to the shape of the fingerprint model used as a reference. This may thus be an indication that the shape may need to be reconfigured or adjusted.

The above given example describes how a fingerprint model may be determined in advance, for a particular subfield, and used further on for the determination of fingerprint models for other subfields, whereby at least part of the shape of the initial fingerprint model is maintained.

It will be understood by the skilled person that the same approach may also be applied for the modelling of more global phenomena, i.e. phenomena extending across the entire surface of the substrate. In such embodiment, one can e.g. determine, based on an extensive set of measurement data, a global fingerprint model characterizing a particular performance parameter. Such a global fingerprint model may then subsequently be used for the modelling of the performance parameter of further substrates, whereby at least part of the shape of the initial global fingerprint model is maintained or fixed, in a similar manner as discussed above.

In a similar manner as described above, the global fingerprint model can make use of a set of basis shapes or functions such as polynomials or spline functions. With respect to the use of spline functions, it can be mentioned that a model that is based on spline functions offers a large fitting freedom. It allows a flexible manner to describe a specific shape when a specific analytic shape is not known.

In the above, it has been mentioned that a particular fingerprint model can be developed or determined for a particular subfield and used further on for the modelling of other subfields, thereby maintained, to a certain extend the shape of the model of the particular fingerprint model. Reference can e.g. be made to equation (4) whereby the shape of the fingerprint model use for the performance parameter P(S1) is assumed to be fixed, i.e. a0, a1, a2, a3, a4 and a5 are fixed parameters obtained by an optimal fitting of the performance parameter P as measured over subfield S0.

As mentioned above, the use of such fixed model assumes that the shape of the local fingerprint model used for the modelling of the subfield performance parameter remains substantially constant.

In an embodiment of the present invention, it is however possible to take account of a variation of the fingerprint model used across a substrate. In such an embodiment, the variables or shape parameters $p_{Si}$ constituting the fingerprint model are not constant but rather are functions that may vary across the substrate. Rather than keeping these parameters constant, one can consider that they may vary across the substrate, and, using an extensive set of measurement data, one can fit a global model to any variations observed for these parameters. Phrased differently, each of the parameters used to describe the fingerprint model of a subfield may be considered a function, e.g. a two-dimensional function, which can thus vary across the substrate. Such variation may be modelled in a substantially similar manner as described for the subfield model, i.e. using a plurality of basis functions such as polynomial functions or spline functions.

In the above given examples for determining a local or a global fingerprint model, the following steps can be recognized:

In a first step, an initial fingerprint model related to a spatial distribution of a performance parameter over a portion of a semiconductor substrate is defined as a parameterized combination of a plurality of basis functions. Examples of such models can e.g. be found in equations (1) and (2).

In a second step, the parameters of the initial fingerprint model are determined using a measurement set representing the performance parameter over an example of the portion of the semiconductor substrate.

In a third step, a fingerprint model for modelling the performance parameter over the portion is determined based on the initial fingerprint model, whereby a ratio of at least two basis functions used in the initial fingerprint model is kept constant.

This third step can also be described as a step whereby a fingerprint model for modelling the performance parameter over the portion is determined based on the initial fingerprint model, whereby at least part of the shape of the initial fingerprint model is maintained in the fingerprint model.

In an embodiment of the present invention, use is made of Legendre polynomials for modelling the fingerprint of the performance parameter either for the modeling of a local fingerprint model, a global fingerprint model or both.

As already mentioned above, at present, performance parameters such as overlay, are determined for an entire substrate and modelled, resulting thus in what is referred to as a global fingerprint model, and subsequently used in so-called advanced process control (APC). The models as used for the modelling of the performance parameter across the substrate can e.g. be polynomial models, i.e. models whereby the basis functions used are polynomials, e.g. low order polynomials. Examples of advanced process control (APC) are described for example in US2012008127A1.

In order to apply corrections or control on a subfield level, local fingerprint models as discussed above can be developed. According to an aspect of the invention optimal sampling schemes can be determined that enables to determine both a global fingerprint model, e.g. used for APC and a local fingerprint model, i.e. at die or subfield level, without the requirement of having a dense measurement or sampling scheme. As discussed above, the fingerprint model as used for modelling local variations of a performance parameter P, e.g. a subfield fingerprint model, may also be determined using polynomial basis functions. It has been observed by the inventors that in case both the global fingerprint model and the local fingerprint model make use of polynomial functions or basis functions, that a cross-talk may occur. In case both models are determined using Cartesian polynomials or basis functions, the local fingerprint model may not be distinguishable from the global fingerprint model used for e.g. APC. As a result, changes made to the global fingerprint model may affect the local fingerprint model, and vice versa, and may require a review or re-measurement of the local fingerprint model parameters.

In order to avoid, or at least mitigate such a cross-talk, it is proposed, in an embodiment of the present invention, to model the local fingerprint model using different basis functions than the global fingerprint model.

Such embodiment of the present invention may e.g. be described as a method of obtaining a fingerprint model comprising:

defining a first fingerprint model related to a first spatial distribution of a performance parameter over a first portion of a substrate as a parameterized combination of a first set of basis functions, defining a second fingerprint model related to a second spatial distribution of the performance parameter over a second portion of the substrate as a parameterized combination of a second set of basis functions, wherein one or more of the first set of basis functions are substantially orthogonal to one or more of the second set of basis functions.

In particular, it has be derived that, the use of Legendre polynomials for the modelling of the local fingerprint can enable a reduction of the cross-talk occurring between the global fingerprint and the local fingerprint. In particular, it can be shown that in case of an infinite number of measurements that are evenly distributed, the cross-talk would reduce to zero. The application of a finite, e.g. comparatively small number of measurements may still result in an important reduction of the cross-talk. The application of Legendre polynomials requires to define a positional boundary condition. In an embodiment, the positional boundary condition for the applied Legendre polynomials is set from $-1$ to 1. By doing so, it is possible to define a set of Legendre polynomials in which the $0^{th}$ and $1^{st}$ order polynomials are the same as for Cartesian polynomials, as illustrated in below table:

| order | Cartesian x-y | Legendre $[-1, 1]$ |
|---|---|---|
| $0^{th}$ | 1 | 1 |
| $1^{st}$ | x | x |
| $2^{nd}$ | $x^2$ | $\dfrac{3x^2 - 1}{2}$ |
| $3^{rd}$ | $x^3$ | $\dfrac{5x^3 - 3x}{2}$ |

By doing so, it is possible to reduce the cross-talk between $0^{th}$ and $1^{st}$ order polynomials of the global fingerprint model, used for APC and higher order parameters defined by the Legendre polynomials. By doing so, a separation between the components of the global fingerprint model and the local fingerprint model can be established. When the Cartesian polynomials are also used with the same positional boundary condition $[-1, 1]$, Legendre polynomials can be easily converted to Cartesian polynomials and vice versa. As a result of the separation of the components of the used fingerprint models, a modification or correction of the parameters of one model can be performed substantially without affecting the other model. In particular, the fingerprint models used can be decomposed into a model with lower order parameters and a model with higher order parameters. As an example, a fingerprint model used for APC control can e.g. include the $0^{th}$ and $1^{st}$ order parameters whereas a fingerprint model for a subfield may include higher order, $>1$, parameters. Such a decomposition may advantageously be applied to determine a sampling strategy for determining, modifying or correcting the applied models. In case advanced process control is based on a fingerprint model having only low order parameters, the low order parameters can be updated with less measurements, whereas the use of a model having higher order parameters may require more measurements for updating. The decomposition may also be used to take account of certain characteristics of the models such as stability. In case there is less cross-talk between the model parameters, it has been found to be easier to monitor the parameters separately. As such, it has been observed that subfield fingerprint models, in particular the higher order components thereof, are relatively stable over time. Based on this, one can e.g. develop a sampling and measurement strategy whereby higher order parameters, e.g. associated with higher order Legendre polynomials may require modeling with dense measurements, but with less frequency, thus reducing the measurement cost. Lower order fingerprint models can e.g. be updated with less measurements but at a higher frequency.

Optionally, the determining the position of the sampling point includes taking into account a drift in the first and/or the second spatial distribution of the performance parameter over time. Such drift may for example occur due to warming up the lithographic apparatus during the exposure of a number of substrates W after starting up.

The method according to any one of the embodiments as described above can of course be used to determine multiple sampling points.

According to a further embodiment, the above embodiments can be used in a method for establishing a sampling scheme is provided, which method comprises:

determining a plurality of sampling points in accordance with any one of the embodiments of the method for determining a sampling scheme as recited above, establishing a sampling scheme which comprises said determined sampling points.

In a sampling scheme that is established in accordance with this embodiment, effective use is made of the sampling points. The number of sampling points is reduced, while still model parameters for both the first and the second fingerprint models can be obtained.

For example, the number of sampling points in a sampling scheme which has been established by the embodiment recited above, is at least 50% less than the number of sampling points that was necessary or was used to establish the first and/or second fingerprint model.

Optionally, the number of sampling points in the sampling scheme which has been established by the embodiment recited above, is at least 75% less than the number of sampling points that was necessary or was used to establish the first and/or second fingerprint model.

The established sampling scheme may also comprise additional sampling points, which are determined in a different way.

Optionally, in the establishing of a sampling scheme the position of critical areas on the substrate W is taken into account. In critical areas, for example the required accuracy is higher than elsewhere on the substrate W, or the acceptable deviations are smaller than elsewhere on the substrate W.

This can be achieved by an embodiment of the above method for establishing a sampling scheme, in which embodiment the method further includes:

identification of one or more critical areas on the semiconductor substrate W, determining a higher number of sampling points per surface area for the one or more critical areas of the semiconductor substrate W than for the other areas of the semiconductor substrate W.

The embodiments of the method for determining a sampling scheme, for determining multiple sampling points and/or for establishing a sampling scheme can be implemented in a method for generating measurement data from a semiconductor substrate, a method for controlling a lithographic apparatus, a computer program product, a semiconductor substrate measurement apparatus, a lithographic apparatus, a lithographic system and a device manufacturing method.

In an embodiment of a method for generating measurement data from a semiconductor substrate, use is made of a sampling point, multiple sampling points and/or a sampling scheme that is determined by one of the embodiments of the method recited above.

For example, an embodiment of a method for generating measurement data from a semiconductor substrate W, comprises the following steps:

determining a position of a sampling point in accordance with any one of the embodiments of the method for determining a sampling scheme as recited above, generating measurement data by measuring the performance parameter at the location of the sampling point on the semiconductor substrate W.

As a further example, an embodiment of a method for generating measurement data from a semiconductor substrate W, comprises the following steps:

receiving information relating to a position of a sampling point, which position has been determined in accordance with any one of the embodiments of the method for determining a sampling scheme as recited above, generating measurement data by measuring the performance parameter at the location of the sampling point on the semiconductor substrate W.

Optionally, this embodiment further comprises the step of determining a model parameter of the first fingerprint model and a model parameter of the second fingerprint model based on the generated measurement data.

In an embodiment of a method for controlling a lithographic apparatus, use is made of a sampling point, multiple sampling points and/or a sampling scheme that is determined by one of the embodiments of the method recited above.

Such an embodiment for example comprise the following steps:

generating and/or receiving measurement data from a semiconductor substrate in accordance with an embodiment of a method for generating measurement data from a semiconductor substrate as recited above, determining a model parameter of the first fingerprint model and a model parameter of the second fingerprint model based on the generated measurement data, arranging a semiconductor substrate in a lithographic apparatus, applying a pattern on said semiconductor substrate in the lithographic apparatus, controlling the application of the pattern based on the basis of control input data, which control input data is at least partly based on said model parameter of the first fingerprint model and/or the model parameter of the second fingerprint model.

The lithographic apparatus is for example a lithographic apparatus in accordance with FIG. 1.

For example, controlling the application of the pattern on the semiconductor substrate includes controlling a movement of the semiconductor substrate relative to the exposure light from the pattern application system of the lithographic apparatus and/or controlling a movement of the patterning device, i.e. reticle, relative to the illumination light of the illumination system. Another example of controlling the application of the pattern on the semiconductor substrate includes controlling the position and/or orientation of lens in the pattern application system, controlling of the illumination setting of the illumination system, controlling of the focus of the exposure light, and/or controlling of the dose of the exposure light.

In this embodiment, the semiconductor substrate from which the measurement data is generated can be the same semiconductor substrate which is arranged in the lithographic apparatus, or a different one.

According to an embodiment of the invention, a computer program product is provided which contains one or more sequences of machine-readable instructions, which is configured to carry out an embodiment of any of the methods recited above.

According to an embodiment of the invention, a computer program product is provided containing one or more sequences of machine-readable instructions, configured to:

receive a sampling point which has been generated in accordance with any one of the embodiments of the method for determining a sampling scheme as recited above, and control a measurement apparatus to generate measurement data from a semiconductor substrate at a measuring location which corresponds to the sampling point, and determine a model parameter of the first fingerprint model and a model parameter of the second fingerprint model on the basis of at least a part of the generated measurement data.

According to an embodiment of the invention, a computer program product is provided containing one or more sequences of machine-readable instructions, configured to:

receive measurement data which has been from a semiconductor substrate at a measuring location which corresponds to the sampling point which has been determined in accordance with any one of the embodiments of the method for determining a sampling scheme as recited above, and determine a model parameter of the first fingerprint model and a model parameter of the second fingerprint model on the basis of at least a part of the received measurement data, control the application of a pattern on a semiconductor substrate based on the basis of control input data, which control input data is at least partly based on said model parameter of the first fingerprint model and/or the model parameter of the second fingerprint model.

According to an embodiment of the invention, a semiconductor substrate measurement apparatus is provided, which apparatus comprises:

an input terminal which is configured to receive a sampling point which has been determined in accordance with any one of the embodiments of the method for determining a sampling scheme as recited above, and a controller which is configured to control the measurement apparatus to generate measurement data from a semiconductor substrate at a measuring location which corresponds to the sampling point, and a processor which is configured to determine a model parameter of the first fingerprint model and a model parameter of the second fingerprint model on the basis of at least a part of the generated measurement data.

According to an embodiment of the invention, a lithographic apparatus is provided, which apparatus comprises:

an input terminal which is configured to receive measurement data which has been from a semiconductor substrate at a measuring location which corresponds to the sampling point which has been determined in accordance with any one of the embodiments of the method for determining a sampling scheme as recited above, and a processor which is configured to determine a model parameter of the first fingerprint model and a model parameter of the second fingerprint model on the basis of at least a part of the received measurement data, and a controller which is configured to control the application of a pattern on a semiconductor substrate based on the basis of control input data, which control input data is at least partly based on said model parameter of the first fingerprint model and/or the model parameter of the second fingerprint model.

According to an embodiment of the invention, a lithographic system is provided, which system comprises a semiconductor substrate measurement apparatus in accordance with an embodiment as recited above and a lithographic apparatus in accordance with an embodiment as recited above.

According to an embodiment of the invention, a device manufacturing method is provided which comprises transferring a pattern from a patterning device onto a substrate, comprising the step of using a lithographic apparatus an embodiment as recited above.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Figure 3:
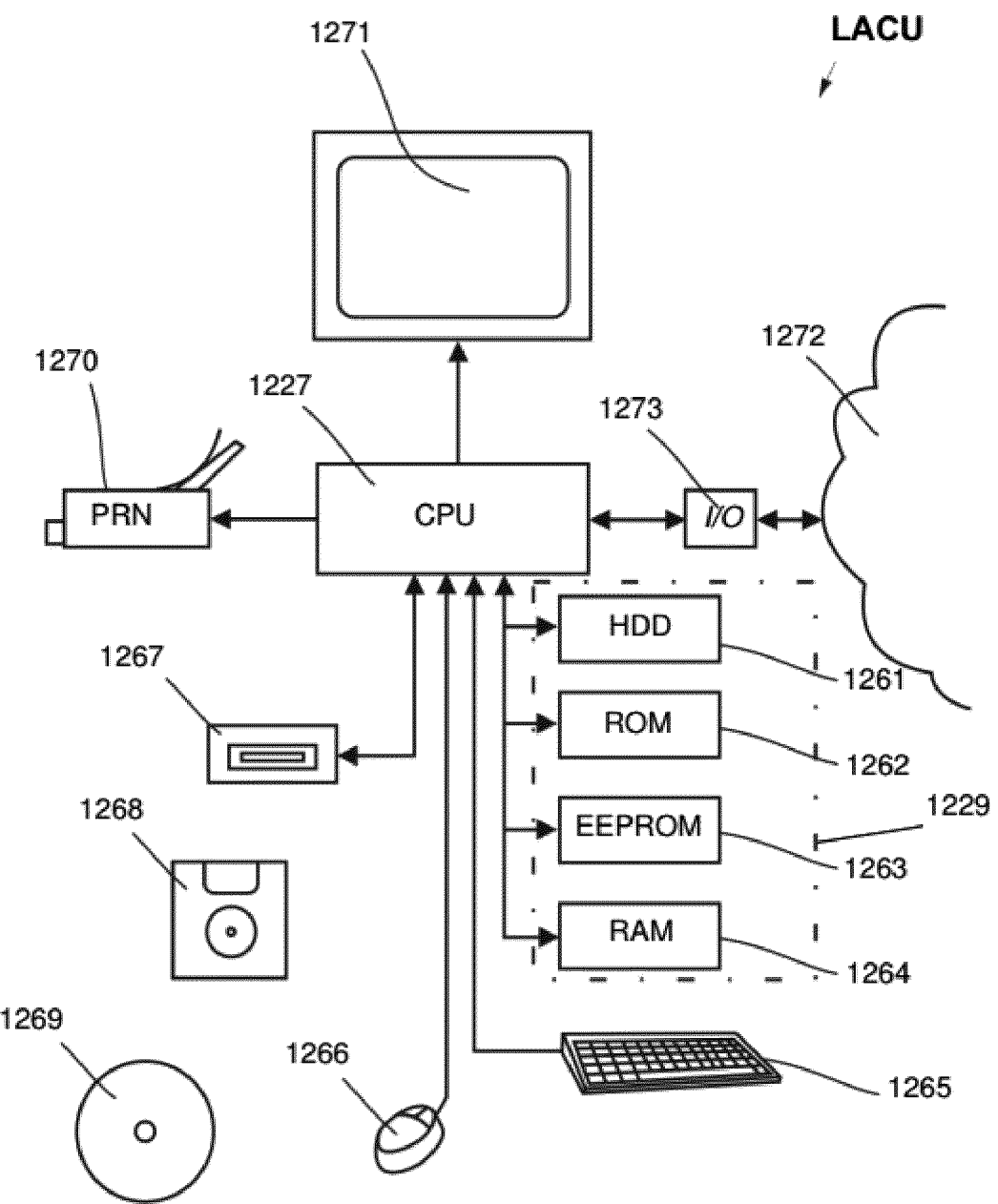
FIG. 3 illustrates computer system hardware useful in implementing the processes disclosed herein.

The steps of the methods described above can be automated within the lithography apparatus control unit LACU shown in FIG. 1. This unit LACU may include a computer assembly as shown in FIG. 3. The computer assembly may be a dedicated computer in the form of a control unit in embodiments of the assembly according to the invention or, alternatively, be a central computer controlling the lithographic projection apparatus. The computer assembly may be arranged for loading a computer program product comprising computer executable code. This may enable the computer assembly, when the computer program product is downloaded, to control aforementioned uses of a lithographic apparatus with embodiments of the level and alignment sensors AS, LS.

Memory 1229 connected to processor 1227 may comprise a number of memory components like a hard disk 1261, Read Only Memory (ROM) 1262, Electrically Erasable Programmable Read Only Memory (EEPROM) 1263 and Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse 1266. A touch screen, track ball, speech converter or other interfaces that are known to persons skilled in the art may also be used.

The processor 1227 may be connected to a reading unit 1267, which is arranged to read data, e.g. in the form of computer executable code, from and under some circumstances store data on a data carrier, like a floppy disc 1268 or a CDROM 1269. Also DVD's or other data carriers known to persons skilled in the art may be used.

The processor 1227 may also be connected to a printer 1270 to print out output data on paper as well as to a display 1271, for instance a monitor or LCD (Liquid Crystal Display), of any other type of display known to a person skilled in the art.

The processor 1227 may be connected to a communications network 1272, for instance a public switched telephone network (PSTN), a local area network (LAN), a wide area network (WAN) etc. by means of transmitters/receivers 1273 responsible for input/output (I/O). The processor 1227 may be arranged to communicate with other communication systems via the communications network 1272. In an embodiment of the invention external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away of the other processing units and communicate via communications network 1272. Connections between modules can be made wired or wireless.

The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "field"/"die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. In addition, it should be appreciated that structural features or method steps shown or described in any one embodiment herein can be used in other embodiments as well.

Currently, to perform a subfield correction, dense sampling data as input for subfield (cell or die based) corrections is required. Furthermore, after etch sampling layout is not optimized to have optimal sampling for APC control (based on full wafer fingerprint control) and separate die/average die based (subfield) correction over time. Until now sampling schemes targeted to achieve both goals has been intensive and expensive.

According to an embodiment of the present invention, an optimal sampling scheme for subfield correction which aims to reduce the number of sampling points while maintaining sufficient coverage across the wafer to enable APC control.

According to an embodiment, the fingerprint across a substrate, intra-field, a subfield, a group of dies, a die, a group of cells, a cell, and/or a subset of a cell may be used to determine an optimal sampling scheme for subfield correction. In an embodiment, the fingerprint may be a fingerprint describing a distribution of a performance parameters such as an overlay error across a plurality of locations on a substrate.

According to an embodiment of the present invention, the fingerprint of a substrate, e.g. wafer, may be divided into multiple, at least two, different fingerprints which have different spatial scales. For example, the fingerprints may be fingerprints across a substrate, a group of substrate, an intra-field fingerprint, a subfield fingerprint, across a group of dies, across a die, across a group of cells, across a cell, and/or across a subset of features within a cell. An optimal sampling scheme may be determined by selection of sample locations across the substrate targeted to minimize a measure of prediction uncertainty of a model configured to capture the at least two different fingerprints. The measure of prediction uncertainty may be a normalized model uncertainty, G-optimality, least square error, moving standard deviation or any other suitable measure.

An optimal sampling scheme may alternatively be determined by obtaining at least two sub-sampling schemes, each for one of the above fingerprints, and by subsequently consolidating the sub-sampling schemes. When consolidating the sub-sampling schemes, some sampling points may be removed from or weighted in the optimal sampling scheme. This may be done, for example, by taking into account temporal/distribution/process characteristics of the fingerprints.

The generation of the sub-sampling schemes may be done by optimizing one, two, or more parameters such as a prediction uncertainty of a model configured to capture the fingerprints of interest, the prediction uncertainty may be a normalized model uncertainty, G-optimality, least square error, moving standard deviation, etc.

In an embodiment of the present invention, an optimal sampling scheme for a substrate may be generated using a model. The model may be associated with a profile that is correctable by using a lithographic apparatus such as exposure apparatus. The model may also take into account a temporal effect, such as drift, and/or a context effect, such as process history, of the fingerprints of the substrate. The optimal sampling scheme may be determined using two or more models each for at least one of the fingerprints with different spatial scales.

Figure 4:
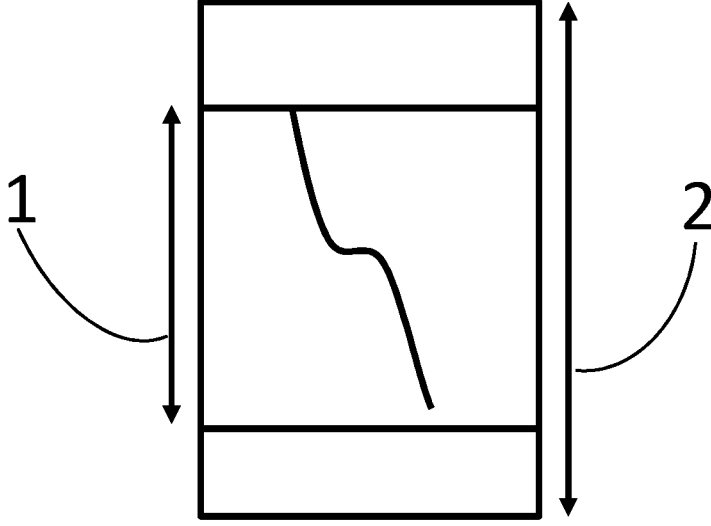
FIG. 4 shows a schematic description of an area of interest with respect to a minimal size of a subfield, FIG. 5 schematically shows a semiconductor substrate, FIG. 6A schematically shows a first fingerprint model of performance parameter P, FIG. 6B schematically shows a second fingerprint model of performance parameter P, FIG. 7 schematically shows a fingerprint model of performance parameter P across a subfield.

FIG. 4 describes an embodiment of the present invention. An optimal sampling scheme may be generated for an area of interest 1 that is smaller than a minimal size of a subfield (a correctable field of a lithographic apparatus) 2. For example, the area 1 may only contain a critical cell of a 3D-NAND excluding non-critical features such as wiring around the cell.

According to an embodiment of the present invention, the optimal sampling scheme may be applied to other sampling layout such as after etch sampling layout. According to an embodiment of the present invention, the optimal sampling scheme may be applied to other measurement data such as focus measurement.

The invention may further be described using the following clauses:

1. A method for determining a sampling scheme, which method comprises:

obtaining a first fingerprint model relating to a first spatial distribution of a performance parameter over a first portion of a semiconductor substrate and a second fingerprint model relating to a second spatial distribution of said performance parameter over a second portion of the semiconductor substrate; and determining a sampling point corresponding to a measuring location on the semiconductor substrate for generating measurement data based on an expected reduction of a first uncertainty metric associated with evaluation of the first fingerprint model over the first portion and an expected reduction of a second uncertainty metric associated with evaluation of the second fingerprint model over the second portion.

2. Method according to clause 1, wherein the first portion and the second portion at least partly overlap with each other.

3. Method according to clause 1 or 2, wherein the first fingerprint model is a global fingerprint model and the second fingerprint model is a local fingerprint model.

4. Method according to any of the preceding clauses, wherein the first portion and/or the second portion is at least a part of an irradiated layer inside the semiconductor substrate or at the top surface of the semiconductor substrate.

5. Method according to any of the preceding clauses, wherein the second fingerprint model comprises a lithographic apparatus correction capability model.

6. Method according to any of the preceding clauses, wherein the first fingerprint model and/or the second fingerprint model comprises a physical model.

7. Method according to clause 6, wherein the physical model comprises a stress profile model.

8. Method according to clause 6 or 7, wherein the physical model comprises a process model.

9. Method according to any of the preceding clauses, wherein the second fingerprint model is associated with a process fingerprint.

10. Method according to clause 9, wherein the process fingerprint comprises a non-zero offset.

11. Method according to any of the preceding clauses, wherein the second portion is one of a field, a plurality of fields, a subfield, plurality of subfields, a die, a plurality of dies, a part of a die, a plurality of parts of dies, a cell, a plurality of cells, a part of a cell, or a plurality of parts of cells.

12. Method according to clause 11, wherein the first fingerprint model is a global model.

13. Method according to any of the preceding clauses, wherein the first portion is a field and the second portion is a sub-field.

14. Method according to any of the preceding clauses, wherein the first fingerprint model is a substrate inner model, and the second fingerprint model is a substrate edge model.

15. Method according to any of the preceding clauses, further comprising:

obtaining a third fingerprint model relating to a third spatial distribution of said performance parameter over a third portion of the semiconductor substrate, wherein determining the sampling point corresponding to the measuring location on the semiconductor substrate for generating measurement data is further based on an expected reduction of a third uncertainty metric associated with evaluation of the third fingerprint model over the third portion.

16. Method according to clause 15, wherein the third fingerprint model comprises a lithographic apparatus correction capability model.

17. Method according to clause 15, further comprising:

obtaining a fourth fingerprint model relating to a fourth spatial distribution of said performance parameter over a fourth portion of the semiconductor substrate, wherein determining the sampling point corresponding to the measuring location on the semiconductor substrate for generating measurement data is further based on an expected reduction of a fourth uncertainty metric associated with evaluation of the fourth fingerprint model over the fourth portion.

18. Method according to clause 17, wherein the first fingerprint model is a global model, the second fingerprint model is a substrate edge model, the third portion is a field, and the fourth portion is a sub-field.

19. Method according to any of the preceding clauses, wherein the performance parameter is overlay error, critical dimension, alignment parameter, side wall angle, line edge roughness, edge placement error, and/or focus error.

20. Method according to any of the preceding clauses, wherein the first fingerprint model and/or the second fingerprint model further relate to the spatial distribution of at least one further parameter.

21. Method according to clause 20, wherein at least one further parameter is a prediction uncertainty of the first fingerprint model and/or the second fingerprint model.

22. Method according to clause 21, wherein the prediction uncertainty is or comprises a normalized model uncertainty, a G-optimality criteria, a least square error and/or a moving standard deviation.

23. Method according to any of the preceding clauses, wherein determining the position of the sampling point includes taking into account a drift in the first and/or the second spatial distribution of the performance parameter over time.

24. Method according to any of the preceding clauses, wherein the method further comprises the step of:

determining an additional sampling point, wherein the number of additional sampling points preferably is less than the number of sampling points that are determined by the method according to any of the preceding clauses.

25. Method according to any of the preceding clauses, wherein the method further includes:

identification of one or more critical areas on the semiconductor substrate, wherein the determining the sampling point is further based on the one or more critical areas.

26. Method for configuring a metrology apparatus comprising the following steps:

determining a position of a sampling point using a method according to any of the preceding clauses, and configuring a metrology apparatus, based on the determined position, for generating measurement data of the performance parameter at the location of the sampling point on the semiconductor substrate.

27. Method for configuring a metrology apparatus comprising the following steps:

receiving information relating to a position of a sampling point, which position has been determined using a method according to any of the preceding clauses 1-25, and configuring a metrology apparatus, based on the received information, for generating measurement data of the performance parameter at the location of the sampling point on the semiconductor substrate.

28. Method for generating measurement data from a semiconductor substrate, which method comprises the following steps:

determining a position of a sampling point using a method according to any of the preceding clauses, generating measurement data by measuring the performance parameter at the location of the sampling point on the semiconductor substrate.

29. Method for generating measurement data from a semiconductor substrate, which method comprises the following steps:

receiving information relating to a position of a sampling point, which position has been determined using a method according to any of the preceding clauses 1-25, generating measurement data by measuring the performance parameter at the location of the sampling point on the semiconductor substrate.

30. Method for determining model parameters, comprising the following steps:

generating measurement data from a semiconductor substrate by using the method according to any of the clauses 28 or 29, determining a model parameter of the first fingerprint model and a model parameter of the second fingerprint model based on the generated measurement data.

31. Method for configuring a lithographic apparatus determining a model parameter of a first fingerprint model and a model parameter of a second fingerprint model by using the method according to clause 30, configuring a lithographic apparatus at least partly based on said model parameter of the first fingerprint model and/or the model parameter of the second fingerprint model.

32. Method for applying a pattern on a semiconductor substrate using a lithographic apparatus comprising the following steps:

determining a model parameter of a first fingerprint model and a model parameter of a second fingerprint model by using the method according to clause 30, applying a pattern on a semiconductor substrate using a lithographic apparatus at least partly based on said model parameter of the first fingerprint model and/or the model parameter of the second fingerprint model.

33. Method according to clause 32, wherein applying the pattern on the semiconductor substrate includes one or more of the following steps: controlling a movement of the semiconductor substrate relative to the exposure light from the pattern application system of the lithographic apparatus and/or controlling a movement of the patterning device, i.e. reticle, relative to the illumination light of the illumination system and/or controlling the position and/or orientation of a lens in the pattern application system, and/or controlling of the illumination setting of the illumination system, and/or controlling of the focus of the exposure light, and/or controlling of the dose of the exposure light.

34. A method of obtaining a fingerprint model for modelling a spatial distribution of a performance parameter over a portion of a substrate, the method comprising:

defining an initial fingerprint model related to the spatial distribution of the performance parameter over the portion as a parameterized combination of basis functions;

determining parameter values for the parameterized combination of basis functions based on pre-knowledge, and determining the fingerprint model for modelling the spatial distribution of the performance parameter over the portion of the substrate, based on a measurement set representing the performance parameter over the portion of a set of one or more semiconductor substrates and the initial fingerprint model, whereby a ratio of at least two parameter values of the basis functions as determined in the initial fingerprint model is kept constant or at least part of the shape of the initial fingerprint model is maintained in the fingerprint model.

35. The method according to clause 34, wherein the pre-knowledge comprises:

a further measurement set representing the performance parameter over the portion of a further set of one or more semiconductor substrates, a result of simulation, process context information, or a result of physical simulation.

36. The method according to clause 35, wherein the physical simulation comprises a simulation of the performance parameter based on a stress distribution over the portion of the substrate, based on etcher tilts over the portion of the substrate.

37. The method according to any of clause 34 to 36, wherein the basis functions are polynomial functions or spline functions.

38. The method according to any of clause 34 to 37, whereby the shape of the initial fingerprint model is maintained in the fingerprint model.

39. The method according to any of the clauses 34 to 38, whereby the fingerprint model is a local fingerprint model.

40. The method according to any of the clauses 34 to 38, whereby the fingerprint model is a global fingerprint model.

41. The method according to any of the clauses 1 to 29, whereby the first fingerprint model or the second fingerprint model is obtained using the method according to any of the clauses 34 to 40.

42. The method according to clause 41 whereby the first fingerprint model or the second fingerprint model is based on Legendre polynomials.

43. A method of obtaining a fingerprint model comprising:

defining a first fingerprint model related to a first spatial distribution of a performance parameter over a first portion of a substrate as a parameterized combination of a first set of basis functions, defining a second fingerprint model related to a second spatial distribution of the performance parameter over a second portion of the substrate as a parameterized combination of a second set of basis functions, wherein one or more of the first set of basis functions are substantially orthogonal to one or more of the second set of basis functions.

44. The method according to clause 43, wherein the first portion comprises the second portion.

45. The method according to clause 43 or 44, wherein the first fingerprint model is a global fingerprint model and the second fingerprint model is a local fingerprint model.

46. The method according to any of clause 43 to 45, wherein the first set of the basis functions is cartesian polynomial functions and the second set of the basis functions is Legendre polynomial functions.

47. The method according to clause 1 to 29, wherein the first fingerprint model is related to a first spatial distribution of a performance parameter over a first portion of a substrate as a parameterized combination of a first set of basis functions, the second fingerprint model is related to a second spatial distribution of the performance parameter over a second portion of the substrate as a parameterized combination of a second set of basis functions, and one or more of the first set of basis functions are substantially orthogonal to one or more of the second set of basis functions.

48. The method according to clause 47, wherein the first portion comprises the second portion.

49. The method according to clause 47 or 48, wherein the first fingerprint model is a global fingerprint model and the second fingerprint model is a local fingerprint model.

50. The method according to any of clause 47 to 49, wherein the first set of the basis functions is cartesian polynomial functions and the second set of the basis functions is Legendre polynomial functions.

51. A computer program product containing one or more sequences of machine-readable instructions configured to carry out the method of any of the preceding clauses.

52. A computer program product containing one or more sequences of machine-readable instructions configured to:

receive a sampling point which has been generated in accordance with the method of any of the clauses 1 to 25, in accordance with clause 41 when dependent on any of the clauses 1 to 25, or in accordance with any of the clause 47 to 50, and control a measurement apparatus to generate measurement data from a semiconductor substrate at a measuring location which corresponds to the sampling point, and determine a model parameter of the first fingerprint model and a model parameter of the second fingerprint model on the basis of at least a part of the generated measurement data.

53. A computer program product containing one or more sequences of machine-readable instructions configured to:

receive measurement data which has been from a semiconductor substrate at a measuring location which corresponds to the sampling point which has been determined by a method according to any of the clauses 1 to 25, in accordance with clause 41 when dependent on any of the clauses 1 to 25, or in accordance with any of the clause 47 to 50, and determine a model parameter of the first fingerprint model and a model parameter of the second fingerprint model on the basis of at least a part of the received measurement data, generate control input data for controlling the application of a pattern on a semiconductor substrate, the control input data being at least partly based on said model parameter of the first fingerprint model and/or the model parameter of the second fingerprint model.

54. Semiconductor substrate measurement apparatus, which apparatus comprises:

an input terminal which is configured to receive a sampling point which has been determined in accordance with the method of any of the clauses 1 to 25, in accordance with clause 41 when dependent on any of the clauses 1 to 25, or in accordance with any of the clause 47 to 50, and a controller which is configured to control the measurement apparatus to generate measurement data from a semiconductor substrate at a measuring location which corresponds to the sampling point, and a processor which is configured to determine a model parameter of the first fingerprint model and a model parameter of the second fingerprint model on the basis of at least a part of the generated measurement data.

55. Lithographic apparatus, which lithographic apparatus comprises:

an input terminal which is configured to receive measurement data which has been from a semiconductor substrate at a measuring location which corresponds to the sampling point which has been determined by a method according to any of the clauses 1 to 25, in accordance with clause 41 when dependent on any of the clauses 1 to 25, or in accordance with any of clause 47 to 50, and a processor which is configured to determine a model parameter of the first fingerprint model and a model parameter of the second fingerprint model on the basis of at least a part of the received measurement data, and a controller which is configured to control the application of a pattern on a semiconductor substrate based on the basis of control input data, which control input data is at least partly based on said model parameter of the first fingerprint model and/or the model parameter of the second fingerprint model.

56. Lithographic system, which comprises a semiconductor substrate measurement apparatus according to clause 54 and a lithographic apparatus according to clause 55.

57. Device manufacturing method comprising transferring a pattern from a patterning device onto a substrate, comprising the step of using a lithographic apparatus according to clause 55.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:

obtaining a first fingerprint model relating to a first spatial distribution of a performance parameter over a first portion of a semiconductor substrate and a second fingerprint model relating to a second spatial distribution of the performance parameter over a second portion of the semiconductor substrate;

determining, by a hardware computer system, a sampling point corresponding to a measuring location on the semiconductor substrate for generating measurement data, based on an expected reduction of a first uncertainty metric associated with evaluation of the first fingerprint model over the first portion and an expected reduction of a second uncertainty metric associated with evaluation of the second fingerprint model over the second portion; and physically configuring or causing a measurement process based on the sampling point and/or providing a signal representing, or based on, the sampling point to a system for use in physical configuration or causation of the measurement process.

2. The method according to claim 1, wherein the first uncertainty metric and/or the second uncertainty metric is a normalized model uncertainty, a G-optimality criteria, a least square error and/or a moving standard deviation.

3. The method according to claim 1, wherein the first fingerprint model is a global fingerprint model and the second fingerprint model is a local fingerprint model, or wherein the first portion and/or the second portion is at least a part of an irradiated layer inside the semiconductor substrate or at the top surface of the semiconductor substrate.

4. The method according to claim 1, wherein the first fingerprint model or the second fingerprint model comprises a physical model.

5. The method according to claim 4, wherein the physical model comprises a stress profile model or a process model.

6. The method according to claim 1, wherein the second fingerprint model is associated with a process fingerprint.

7. The method according to claim 6, wherein the process fingerprint comprises a non-zero offset.

8. The method according to claim 1, wherein the second portion is a field, a plurality of fields, a subfield, a plurality of subfields, a die, a plurality of dies, a part of a die, a plurality of parts of dies, a cell, a plurality of cells, a part of a cell, or a plurality of parts of cells.

9. The method according to claim 1, wherein the first portion is a field and the second portion is a sub-field.

10. The method according to claim 1, wherein the first fingerprint model is a substrate inner model, and the second fingerprint model is a substrate edge model.

11. The method according to claim 1, further comprising:
obtaining a third fingerprint model relating to a third spatial distribution of the performance parameter over a third portion of the semiconductor substrate,
wherein determining the sampling point corresponding to the measuring location on the semiconductor substrate for generating measurement data is further based on an expected reduction of a third uncertainty metric associated with evaluation of the third fingerprint model over the third portion, and
wherein the third fingerprint model comprises a lithographic apparatus correction capability model.

12. The method according to claim 1, further comprising:
obtaining a third fingerprint model relating to a third spatial distribution of the performance parameter over a third portion of the semiconductor substrate,
obtaining a fourth fingerprint model relating to a fourth spatial distribution of the performance parameter over a fourth portion of the semiconductor substrate,
wherein determining the sampling point corresponding to the measuring location on the semiconductor substrate for generating measurement data is further based on an expected reduction of a third uncertainty metric associated with evaluation of the third fingerprint model over the third portion and a fourth uncertainty metric associated with evaluation of the fourth fingerprint model over the fourth portion, and
wherein the first fingerprint model is a global model, the second fingerprint model is a substrate edge model, the third portion is a field, and the fourth portion is a sub-field.

13. The method according to claim 1, wherein the first fingerprint model or the second fingerprint model is obtained using a process comprising:
defining an initial fingerprint model related to the spatial distribution of the performance parameter over the applicable portion as a parameterized combination of basis functions;
determining parameter values for the parameterized combination of basis functions based on pre-knowledge, and
determining the applicable fingerprint model based on a measurement set representing the performance parameter over the applicable portion of a set of one or more semiconductor substrates and the initial fingerprint model, wherein a ratio of at least two parameter values of the basis functions as determined in the initial fingerprint model is kept constant or at least part of the shape of the initial fingerprint model is maintained in the applicable fingerprint model.

14. The method according to claim 1, wherein the first fingerprint model is related to the first spatial distribution of the performance parameter over the first portion of the substrate as a parameterized combination of a first set of basis functions, the second fingerprint model is related to the second spatial distribution of the performance parameter over the second portion of the substrate as a parameterized combination of a second set of basis functions, and one or more basis functions of the first set of basis functions are substantially orthogonal to one or more basis functions of the second set of basis functions.

15. A semiconductor substrate measurement apparatus comprising:
an input terminal configured to receive a sampling point which has been determined in accordance with the method of claim 1, and
a controller configured to control the measurement apparatus to generate measurement data from a semiconductor substrate at a measuring location which corresponds to the sampling point, and
a processor configured to determine a model parameter of the first fingerprint model and a model parameter of the second fingerprint model on the basis of at least a part of the generated measurement data.

16. A lithographic apparatus comprising:
an input terminal configured to receive measurement data which has been generated from a semiconductor substrate at a measuring location which corresponds to the sampling point which has been determined by the method according to claim 1, and
a processor configured to determine a model parameter of the first fingerprint model and a model parameter of the second fingerprint model on the basis of at least a part of the received measurement data, and
a controller configured to control application of a pattern on a semiconductor substrate based on control input data, which control input data is at least partly based on the model parameter of the first fingerprint model and/or the model parameter of the second fingerprint model.

17. The method according to claim 1, wherein the first fingerprint model is a global model.

18. The method according to claim 1, wherein the performance parameter is overlay error, critical dimension, alignment parameter, side wall angle, line edge roughness, edge placement error, and/or focus error.

19. The method according to claim 1, wherein determining the position of the sampling point includes taking into account a drift in the first and/or the second spatial distribution of the performance parameter over time.

20. The method according to claim 1, further comprising identifying one or more critical areas on the semiconductor substrate, and wherein the determining the sampling point is further based on the one or more critical areas.

21. A non-transitory computer-readable medium comprising instructions therein, the instructions, when executed by a computer system, are configured to cause the computer system to at least:
obtain a first fingerprint model relating to a first spatial distribution of a performance parameter over a first portion of a semiconductor substrate and a second fingerprint model relating to a second spatial distribution of the performance parameter over a second portion of the semiconductor substrate;
determine a sampling point corresponding to a measuring location on the semiconductor substrate for generating measurement data, based on an expected reduction of a first uncertainty metric associated with evaluation of the first fingerprint model over the first portion and an expected reduction of a second uncertainty metric associated with evaluation of the second fingerprint model over the second portion; and
physically configure or cause a measurement process based on the sampling point and/or provide a signal representing, or based on, the sampling point to a system for use in physical configuration or causation of the measurement process.

* * * * *